(12) United States Patent
Takahara et al.

(10) Patent No.: US 10,414,847 B2
(45) Date of Patent: Sep. 17, 2019

(54) POLYMER BRUSH

(71) Applicant: JAPAN SCIENCE AND TECHNOLOGY AGENCY, Saitama (JP)

(72) Inventors: Atsushi Takahara, Fukuoka (JP); Hiroshi Jinnai, Fukuoka (JP); Daiki Murakami, Fukuoka (JP); Yuki Norizoe, Ibaraki (JP)

(73) Assignee: JAPAN SCIENCE AND TECHNOLOGY AGENCY, Saitama (JP)

( * ) Notice: Subject to any disclaimer, the term of this patent is extended or adjusted under 35 U.S.C. 154(b) by 109 days.

(21) Appl. No.: 15/309,471

(22) PCT Filed: May 8, 2015

(86) PCT No.: PCT/JP2015/063241
§ 371 (c)(1),
(2) Date: Nov. 8, 2016

(87) PCT Pub. No.: WO2015/170724
PCT Pub. Date: Nov. 12, 2015

(65) Prior Publication Data
US 2017/0152339 A1  Jun. 1, 2017

(30) Foreign Application Priority Data
May 8, 2014 (JP) .................. 2014-097007

(51) Int. Cl.
C08F 292/00 (2006.01)
C08F 112/08 (2006.01)
G03F 7/00 (2006.01)

(52) U.S. Cl.
CPC .......... *C08F 292/00* (2013.01); *C08F 112/08* (2013.01); *G03F 7/0002* (2013.01); *C08F 2438/01* (2013.01)

(58) Field of Classification Search
CPC .. C08F 292/00; C08F 112/08; C08F 2438/01; G03F 7/0002
See application file for complete search history.

(56) References Cited

U.S. PATENT DOCUMENTS

| | | |
|---|---|---|
| 2003/0018136 A1 | 1/2003 | Poncelet |
| 2013/0075360 A1 | 3/2013 | Nakamura et al. |
| 2013/0133825 A1 | 5/2013 | Hattori et al. |
| 2013/0203883 A1 | 8/2013 | Minagawa |
| 2014/0066343 A1 | 3/2014 | Bielecki et al. |

FOREIGN PATENT DOCUMENTS

| | | |
|---|---|---|
| CN | 102875195 | 1/2013 |
| JP | 2001-98014 | 4/2001 |
| JP | 2008-133434 | 6/2008 |
| JP | 2010-261001 | 11/2010 |
| JP | 2012-33534 | 2/2012 |
| JP | 2013-73974 | 4/2013 |
| JP | 2013-159667 | 8/2013 |
| JP | 2013-231757 | 11/2013 |
| WO | 2012/152512 | 11/2012 |

OTHER PUBLICATIONS

W. Zhao et al., Lateral Structure of a Grafted polymer Layer in a Poor Solvent, Macromolecules, vol. 27, No. 11, pp. 2933-2935.*
Office Action dated Jan. 2, 2018 in corresponding Chinese Application No. 201580023123.X, with English translation.
W. Zhao et al., "Lateral Structure of a Grafted Polymer Layer in a Poor Solvent", Macromolecules, May 31, 1994, vol. 27, No. 11, pp. 2933-2935.
W. Zhang, "Phase behavior and phase separation kinetics in polymer solutions under high pressure", Dissertation Abstracts International, vol. 66-02, Section: B, Dec. 31, 2005, pp. 135-166.
Spatz et al. "Nanomosaic Surfaces by Lateral Phase Separation of a Diblock Copolymer", Macromolecules, vol. 30, Dec. 31, 1997, pp. 3874-3880.
Koutsos et al., "Structure of Chemically End-Grafted Polymer Chains Studied by Scanning Force Microscopy in Bad-Solvent Conditions", Macromolecules, vol. 30, Dec. 31, 1997, pp. 4719-4726.
O'Driscoll et al., "Lateral Phase Separation in Grafted Diblock Copolymer Films" Macromolecules, vol. 43, Dec. 31, 2010, pp. 8177-8184.
Extended European Search Report dated Nov. 17, 2017 in corresponding European Application No. 15788757.1.
O'Driscoll et al., "Lateral Phase Separation in Grafted Diblock Copolymer Films", Macromolecules, vol. 43, No. 19, Oct. 2010, pp. 8177-8184.
Murakami et al., "Direct Characterization of In-Plane Separation in Polystyrene Brush/Cyclohexane System", Macromoleules, vol. 49, No. 13, Jul. 2016, pp. 4862-4866.
International Search Report dated Aug. 11, 2015 in International (PCT) Application No. PCT/JP2015/063241.
Norizoe et al., "Molecular simulation of 2-dimensional microphase separation of single-component homopolymers grafted on to a planar substrate", A Letters Journal Exploring the Frontiers of Physics, vol. 101, Jan. 16, 2013, pp. 16006-p1 to 16006-p6.
Office Action dated Jan. 17, 2019 in corresponding Taiwanese Application No. 104114672, with English translation.
Zhao et al., "Lateral Structure of a Grafted Polymer Layer in a Poor Solvent", Macromolecules, vol. 27, No. 11, 1994, pp. 2933-2935.
Second Office Action dated Nov. 20, 2018 in corresponding Chinese Patent Application No. 201580023123.X with English translation.

(Continued)

*Primary Examiner* — Robert D Harlan
(74) *Attorney, Agent, or Firm* — Wenderoth, Lind & Ponack, L.L.P.

(57) ABSTRACT

The object of the present invention is to provide a polymer brush which forms phase-separated structure in a gas phase. The polymer brush according to the present invention comprises a substrate and a polymer layer wherein the polymer layer comprises polymer chains each of which has one end fixed on the substrate and other end free-ended, and wherein a state of phase-separation between a polymer dense part and a polymer thin part reversibly changes in the polymer layer.

15 Claims, 5 Drawing Sheets

(56) References Cited

OTHER PUBLICATIONS

Kobayashi et al., "Applications of Polymer Brushes to Structural Nano-Coatings", Nanotechnology Materials and Devices Conference, Oct. 21, 2011, pp. 69-74.
Communication pursuant to Article 94(3) EPC dated Mar. 29, 2019 in corresponding European Patent Application No. 15788757.1.
Examination Rejection Decision dated Apr. 29, 2019 in Taiwanese Application No. 104114672, with English translation.
Office Action dated Apr. 30, 2019 in Chinese Application No. 201580023123.X, with English translation.

* cited by examiner

[Fig 1]
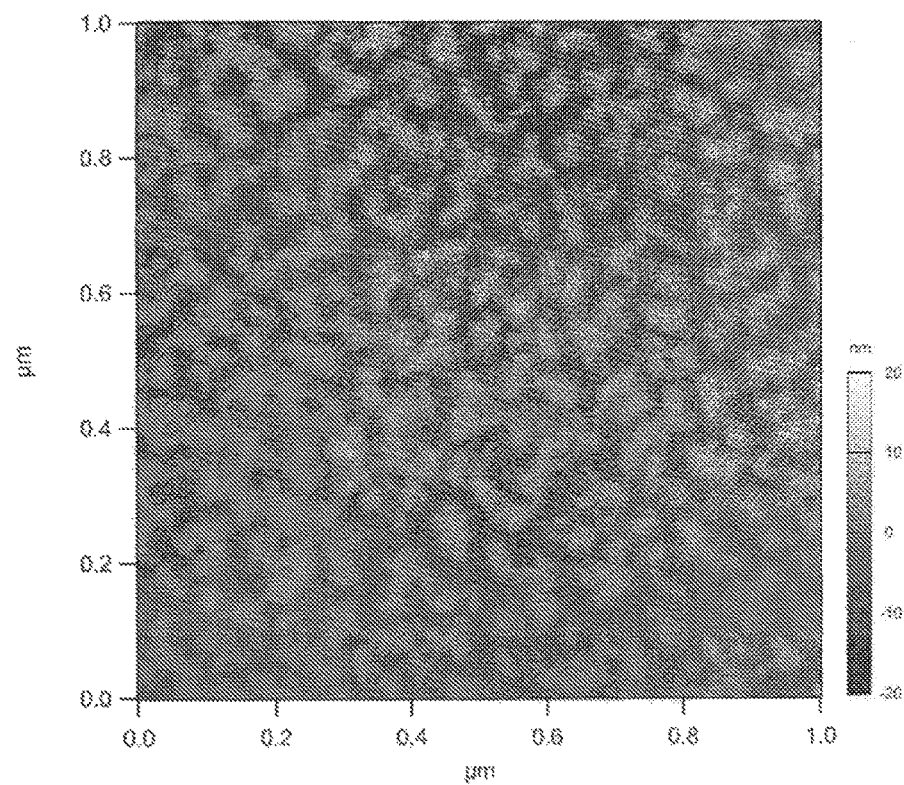
[Fig 2]
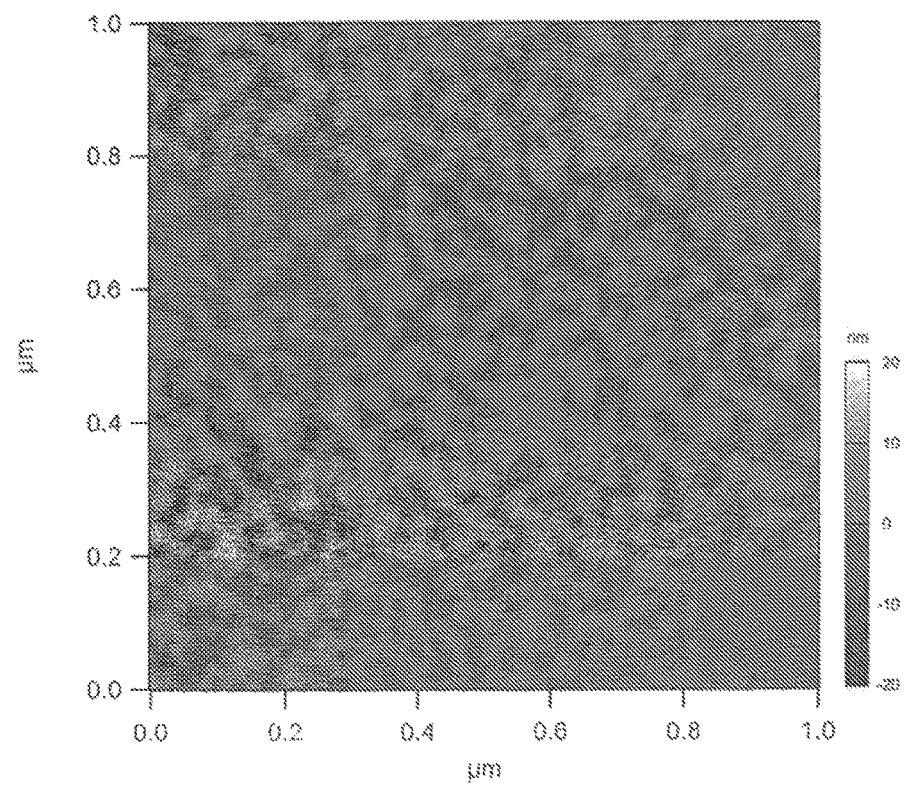

[Fig 3]
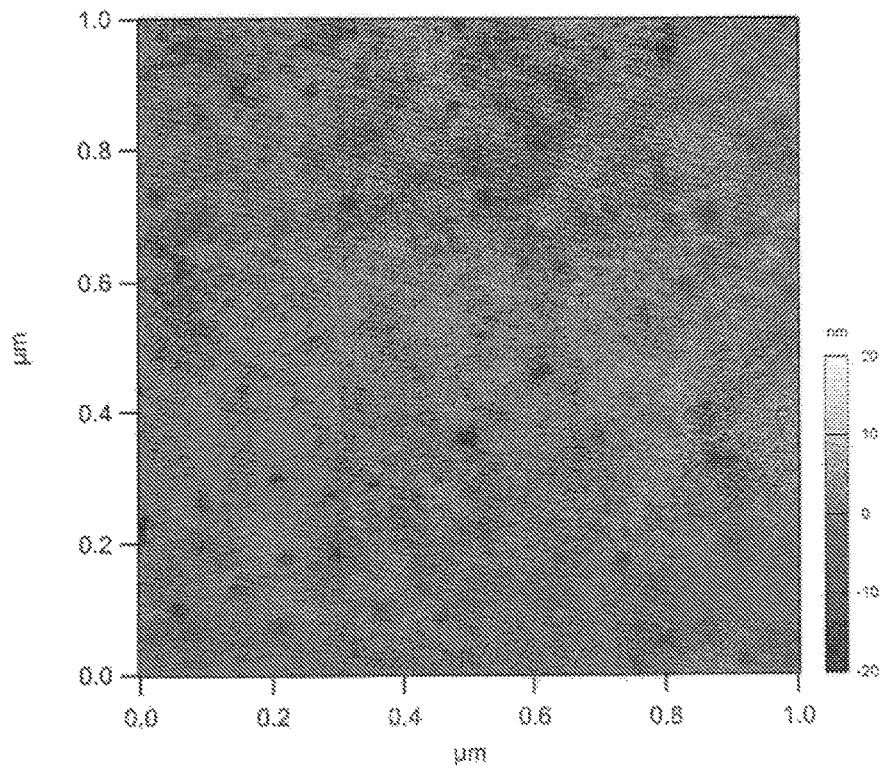
[Fig 4]
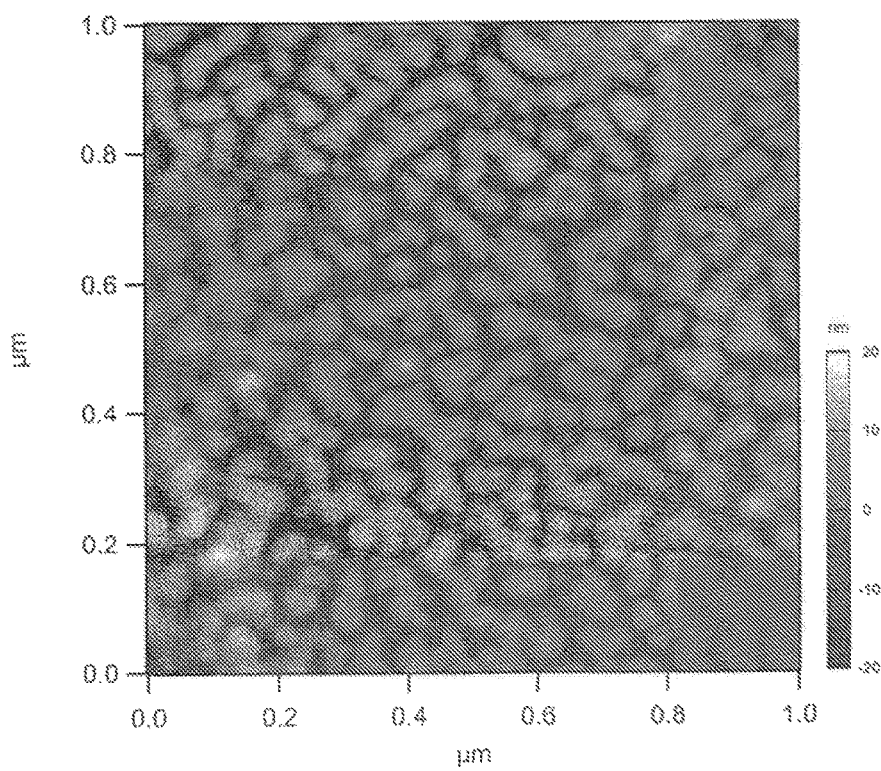

[Fig 5]
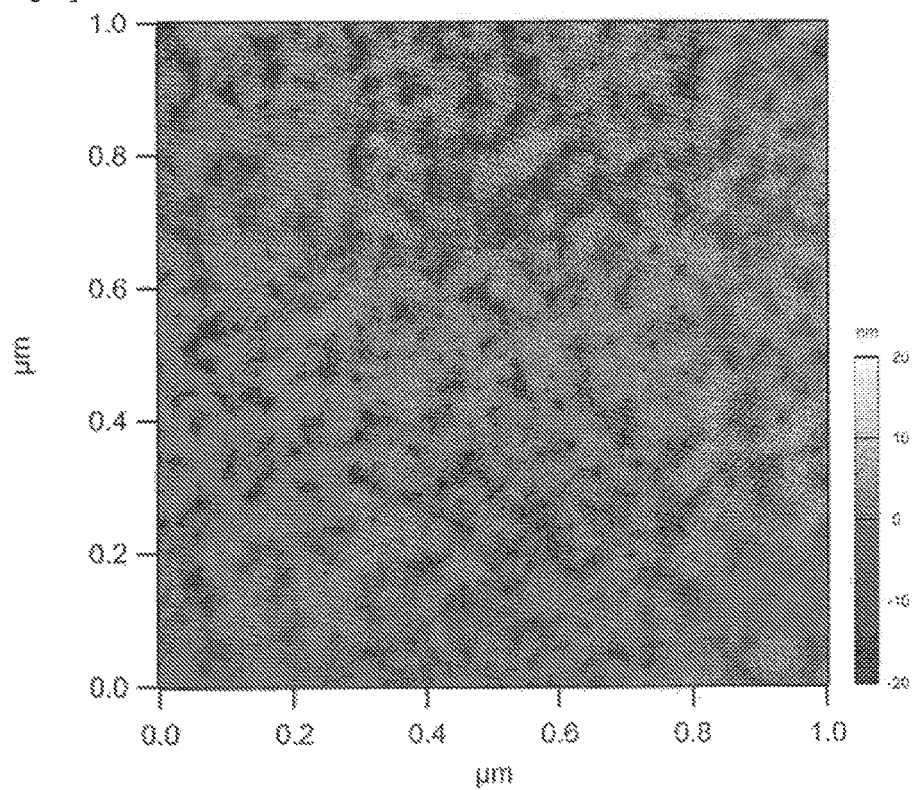
[Fig 6]
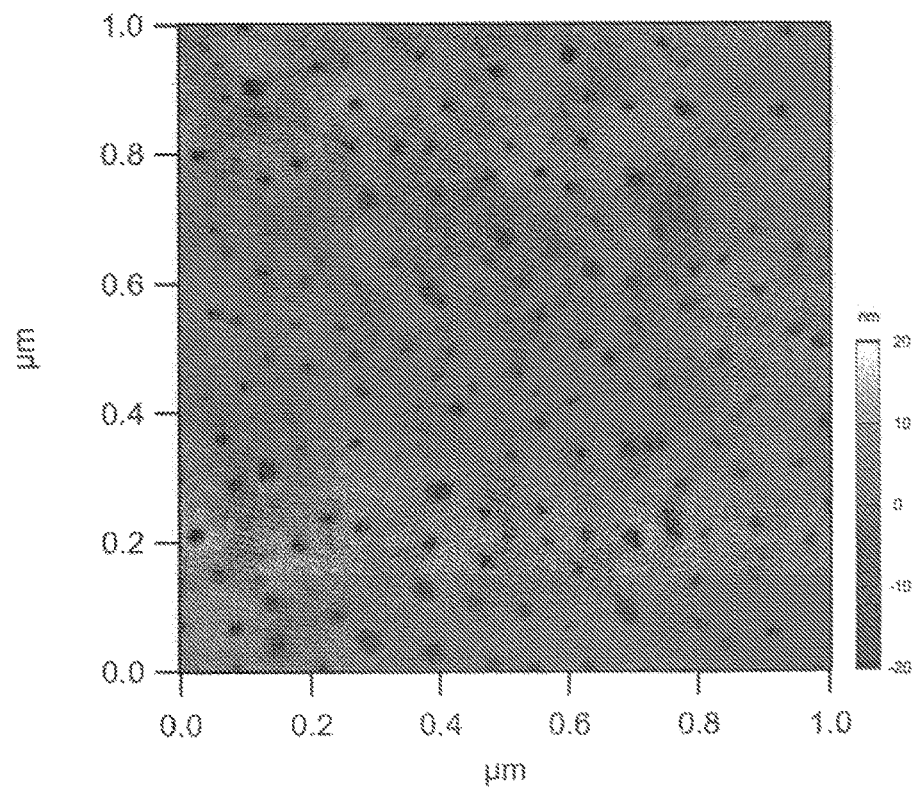

[Fig 7]
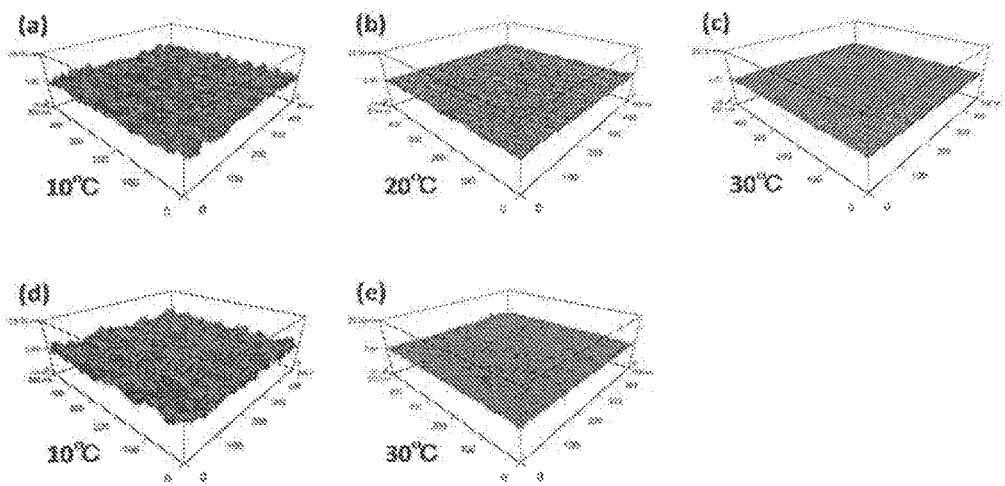
[Fig 8]
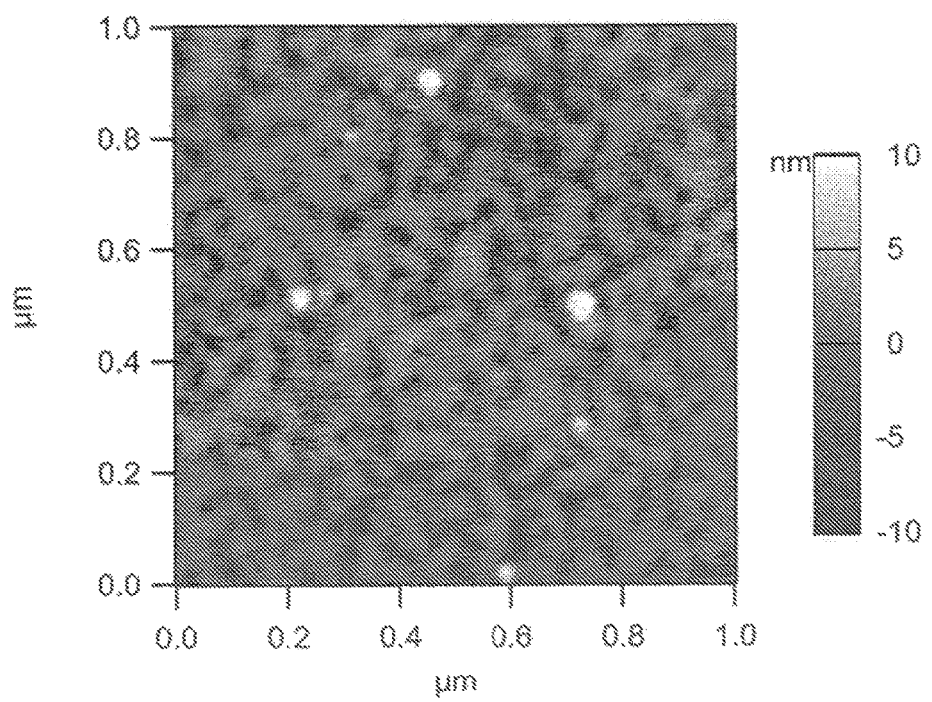

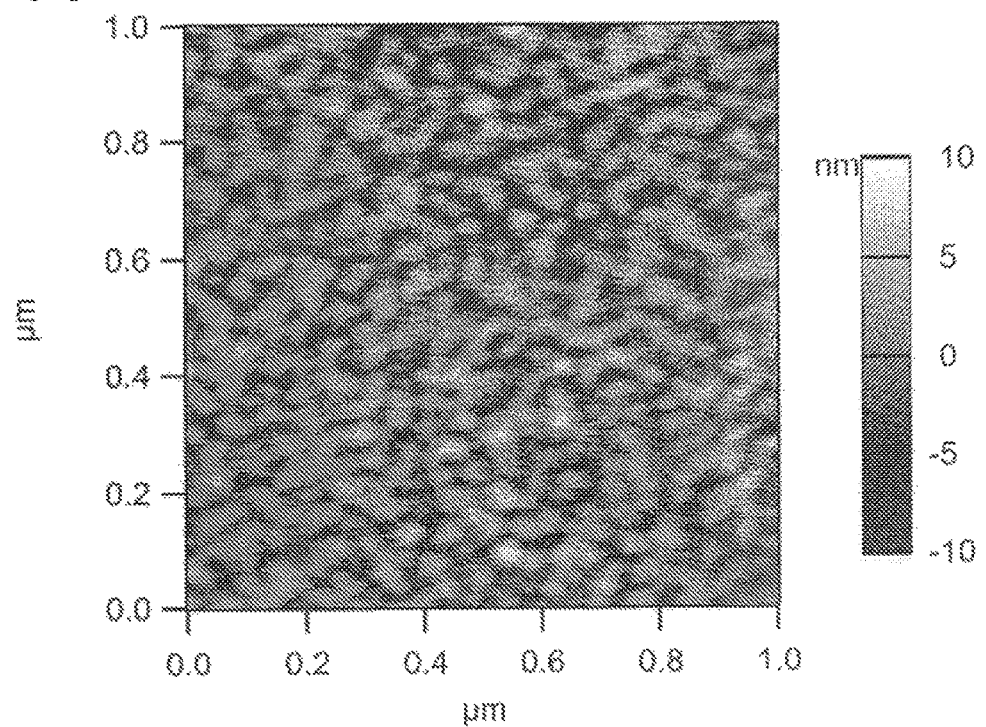
[Fig 9]

POLYMER BRUSH

TECHNICAL FIELD

The present invention relates to a polymer brush having one end fixed on a substrate.

BACKGROUND ART

A polymer brush comprising a polymer which has one end fixed on a substrate is one of a surface modification means for a substrate, and is known to provide a characteristics such as hydrophilicity or low frictional properties on the substrate surface (patent documents 1, 2). The polymer brush is also suggested from a simulation to have a possibility to phase-separate between a polymer brush and a solvent phases when the polymer brush is placed in a certain solvent (non-patent document 1). There is, however, no example that achieved a phase-separation between a polymer brush and a solvent phases, and the exact method is not demonstrated.

Further, the phase-separation between a polymer and a solvent phases occurs only in the presence of a solvent, and the phase-separated structure is not known in a gas phase with no solvent existence. The realization method is not understood moreover. In light of technical application to devices, the availability of the polymer brush further advances with the achievement of a phase-separated structure in a gas phase. However, the phase-separated structure formation in a gas phase is not suggested in a simulation, and there is no implemented examples.

PRIOR ART DOCUMENTS

Patent Documents

Patent Document 1: JP2008-133434 A
Patent Document 2: JP2010-261001 A

Non-Patent Documents

Non-Patent Document 1: Y. Norizoe, et al., "Molecular simulation of 2-dimensional microphase separation of single-component homopolymers grafted onto a planar substrate", Europhysics Letters, 16 Jan. 2013, 101, 16006

SUMMARY OF THE INVENTION

Problems to be Solved by the Invention

In the light of the circumstances, the object of the present invention is to provide a polymer brush which forms phase-separated structure in a gas phase.

Solutions to the Problems

A polymer brush is different from a normal polymer at the aspect that one end of the polymer chain is fixed on a substrate, and a polymer brush does not dissolve in a solvent perfectly (always separated from a solvent). The free-end side of the polymer layer in a polymer brush does not interact in the planar direction and hence the interinfluence in the thickness direction is amplified to provide a different mechanical state from those observed in normal three dimension. Because of further difference in the fixed state of the polymer, the phase-separation state in a polymer brush has been regarded as different apart from normal polymers. However, the phase-separation behavior between a polymer brush and a solvent phases is surprisingly found by the present inventors to have high correlation with a phase-separation behavior between a polymer and solvent phases in a polymer solution from the examination. Polymer brush layer is fairly thin and the obtained phase-separated structure is also fine, and hence it is known the light scattering behaviors such as cloud are not observed. Considering that a phase-separation in a normal polymer solution is understood to provide a macroscopic phase-separation which can be confirmed from a cloud as a light scattering behavior, it is very surprising that the high correlation is observed in spite of the fact that the phase-separation behavior in a polymer brush phase is different from the phase-separation behavior of the polymer solution and further the dissolution and mechanical state is also different as described previously. The present inventors accomplished the present invention by discovering that by contacting a polymer brush with a solvent in a condition resembled to the condition where polymer solution phase-separates, a phase-separated state evolves which resembles to the polymer solution case, that a phase-separated structure of a polymer brush in a gas phase is formed by exchanging a solvent to a gas under a certain temperature to allow the solvent phase part to be replaced by a gas while keeping the phase-separated structure, and that the phase-separated structure of a polymer brush formed in a gas phase can be conditioned with heating.

That is, a polymer brush according to the present invention comprises a substrate and a polymer layer wherein the polymer layer comprises polymer chains each of which has one end fixed on the substrate and other end free-ended, and wherein a state of phase-separation between a polymer dense part and a polymer thin part reversibly changes in the polymer layer. The polymer layer thickness is preferably not less than 1 nm and not more than 50 nm provided that the polymer layer is in a non-phase-separated state, and wherein the number average molecular weight of the polymer chain is not less than 2,000 and not more than 1,000,000. It is preferable that the phase-separated structure is reversibly controlled with the exterior environment change. The exterior environment is preferably any one selected from temperature, pressure, and ion concentration.

The present invention includes a phase separated type polymer brush comprising a substrate and a polymer layer wherein the polymer layer comprises a polymer chain each of which has one end fixed on the substrate and other end free-ended, and wherein a polymer dense part and a polymer thin part is formed in the polymer layer. The plurality of the polymer dense parts and the plurality of the polymer thin parts preferably appear periodically and repeatedly in the planar direction in the polymer layer.

A structure formed by a phase-separation between the polymer dense part and the polymer thin part is preferably any one selected from sea-island structure, cylinder structure, interlinked structure, and lamellar structure.

The present invention includes also a process for controlling a surface state comprising contacting the polymer brush with a solvent, and changing exterior environment. The exterior environment change is preferably provided by any one selected from the solvent temperature, pressure and ion concentration.

A process for producing a phase-separated type polymer brush according to the present invention comprises contacting a polymer brush (A) comprising a substrate and a polymer layer with a solvent (B) wherein the polymer layer comprises a polymer chain each of which has one end fixed on the substrate with fixed-end density of $\sigma$ ($nm^{-2}$) and other end free-ended at a temperature where a solution of the polymer chain with the polymer concentration determined by the following formula (1) is in a phase-separated state in a phase diagram provided that the polymer chain is in a free state without bonding to the substrate, and replacing the solvent to a gas below the glass transition temperature of the polymer while keeping the temperature within the phase-separated state in the phase diagram.

$$\text{Polymer concentration (volume \%)} = \sigma \, (nm^{-2}) * \text{number average molecular weight of the polymer chain } (g/mol) * 10^{21}/(\text{root mean square end-to-end distance of free polymer chain } (nm) * \text{Avogadro number, } Na \, (mol^{-1}) * \text{polymer chain density } (g/cm^3)) \quad (1)$$

The fixed end density of the polymer chain, $\sigma$ is preferably not less than 0.001 ($nm^{-2}$) and not more than 0.1 ($nm^{-2}$). The solvent (B) is preferably a solvent with a binodal start temperature of not less than 1° C. and not more than 100° C. provided that the solvent (B) is mixed with the polymer chain in a free state without bonding to the substrate at a polymer concentration determined by the previous formula (1).

The combination of the polymer and the solvent (B) is preferably (1) polymer: aromatic hydrocarbon polymer, and solvent: hydrocarbon solvent, or (2) polymer: (meth)acryl polymer, and solvent: water-based solvent.

The present invention further includes a process for preparing phase-separated structure comprising heating the polymer brush over grass transition temperature of the polymer. The present invention includes also a surface modified member having the polymer brush formed on the surface of the member.

Effects of the Invention

A producing process according to the present invention provides a polymer brush with a phase-separated structure in a gas phase since a polymer brush (A) and a solvent (B) is contacted in a certain condition, and the solvent (B) is exchanged to a gas under a certain temperature.

BRIEF DESCRIPTION OF THE DRAWINGS

FIG. 1 represents an AFM image of the phase-separated structure (normal pressure (1013 hPa), 10° C.) of the phase-separated type polymer brush No. 3 in cyclohexane.

FIG. 2 represents an AFM image of the phase-separated structure (normal pressure, 10° C.) of the phase-separated type polymer brush No. 2 in cyclohexane.

FIG. 3 represents an AFM image of the phase-separated structure (normal pressure, 10° C.) of the phase-separated type polymer brush No. 1 in cyclohexane.

FIG. 4 represents an AFM image of the phase-separated structure (normal pressure, room temperature (25° C.)) of the phase-separated type polymer brush No. 3 in a gas phase.

FIG. 5 represents an AFM image of the phase-separated structure (normal pressure, room temperature) of the phase-separated type polymer brush No. 2 in a gas phase.

FIG. 6 represents an AFM image of the phase-separated structure (normal pressure, room temperature) of the phase-separated type polymer brush No. 1 in a gas phase.

FIG. 7 represents AFM images of the series of the phase-separated structures of the polymer brush No. 1 under the normal pressure at the temperature of (a) 10° C., (b) 20° C., (c) 30° C., (d) 10° C., and (e) 30° C.

FIG. 8 represents an AFM image of the phase-separated structure (normal pressure, 10° C.) of the phase-separated type polymer brush No. 4 in water.

FIG. 9 represents an AFM image of the phase-separated structure (normal pressure, 10° C.) of the phase-separated type polymer brush No. 5 in water.

MODE FOR CARRYING OUT THE INVENTION

1. Process for Preparing a Phase-Separated Type Polymer Brush

Polymer brush (A) represents a structure wherein several polymer chains are bonded at one end of them to a substrate. The present invention is focused on the assembling state on the free end of the polymer chain, and the main subject is to produce a phase-separated type polymer brush wherein the free end is phase-separated in a gas phase. The phase-separated type polymer brush in a gas phase is produced by treating a polymer brush (A) in a solvent (B) under certain condition to phase-separate the polymer chain from a liquid phase, and exchanging the liquid phase to a gas while keeping the phase-separated state.

1-1. Polymer Brush (A)

As mentioned above, a polymer brush (A) is used in the present invention. More specifically, the polymer brush (A) comprises a substrate and a plurality of polymer chains, wherein each of the polymer chains has one end fixed on the surface of the substrate and other end unfixed on any part and hence free-ended. Due to this one end-fixed structure, the phase-separated structure does not stay on growing in coarse and hence it becomes possible to form a phase-separated structure having a specific size corresponding to the number average molecular weight of the polymer chains.

The material for the substrate is not particularly limited as long as one end of the each polymer chain can be bonded to the substrate, and any of an inorganic material and an organic material can be used as the material. Examples of the inorganic material include metals such as gold, iron, aluminum and silicon, alloys of these metals, and metal oxides of these metals such as glass. Examples of the organic material include resins such as a (meth)acrylic resin and an olefin resin. In light of the fixing of a functional group which serves as an initiation point of the above-mentioned polymerization reaction and the control of the fixed-end density, it is preferred that the substrate contains a silicon atom-containing compound, such as glass or silicon; a metal with which a thiol group can coordinate, such as gold; or a metal capable of forming a salt in conjunction with phosphoric acid, such as iron or aluminum.

The shape of the substrate surface is not particularly limited, and may be any of flat and curved. Examples of a flat-surface substrate to be used include a plate-like substrate, a sheet-like substrate and a film-like substrate. Examples of a curved-surface substrate to be used include a particulate substrate, a columnar substrate, a tubular substrate, and a linear substrate.

The amount of the polymer chains fixed on the substrate can be evaluated in terms of a fixed-end density $\sigma$ ($nm^{-2}$), which represents the average number of polymer chains fixed per 1 $nm^2$ of the substrate. The fixed-end density $\sigma$ is preferably not less than 0.0001 ($nm^{-2}$) and not more than 0.2 ($nm^{-2}$), more preferably not less than 0.0005 ($nm^{-2}$), still more preferably not less than 0.001 ($nm^{-2}$), and is more preferably not more than 0.16 ($nm^{-2}$), still more preferably not more than 0.07 ($nm^{-2}$). When the fixed-end density falls within the above-mentioned range, a phase-separated structure can be formed easily.

In the case where the fixed-end density is high, the number of polymer chains fixed per area of the substrate becomes large, and hence the polymer chains tend to extend in a vertical direction relative to the substrate, resulting in the increase in the thickness of the polymer brush layer in a non-phase-separated state. In contrast to this, in the case where the fixed-end density is low, the number of polymer chains fixed per area of the substrate becomes small, and hence the polymer chains tend to extend in the direction of the substrate surface, resulting in the decrease in the thickness of the polymer brush layer. By utilizing this phenomenon, the fixed-end density σ can be calculated on the basis of the thickness L of the polymer brush layer in a non-phase-separated state and the number average molecular weight Mn and the density d of the polymer chains. Specifically, the fixed-end density σ is expressed by the formula shown below. In the formula, $N_A$ represents an Avogadro number.

$$\sigma = dLN_A Mn$$

The thickness L of the polymer brush layer in a non-phase-separated state is preferably not less than 1 nm, more preferably not less than 2 nm, still more preferably not less than 3 nm, and is preferably not more than 50 nm, more preferably not more than 40 nm, still more preferably not more than 35 nm, particularly preferably not more than 30 nm.

The thickness L of the polymer brush layer in a non-phase-separated state can be measured with an ellipsometer. The density d of the polymer chains means the density of the corresponding polymer (of which the end is not fixed on the substrate through a polymer chain) and can be measured by the method prescribed in JIS K 7112 (1999).

An example of a polymer (P1) to be used in the polymer brush (A) is a non-crosslinkable polymer such as a linear polymer, particularly a radical-polymerizable polymer. The polymer may be a polymer having no polar group (for example, a hydrocarbon polymer), or may be a polymer having a moderate polar group (for example, a carboxylic acid group, an ester group, a lactone ring, an amide group). Among these polymers, examples of the radical-polymerizable polymer include: vinyl polymers such as an aromatic hydrocarbon polymer, a (meth)acrylic polymer, a vinylpyridine polymer, a vinylester polymer, a vinylpyrrolidone polymer and an olefin polymer; and copolymers each composed of a proper combination of two or more of monomers used in the above-mentioned polymers.

These polymers may be used singly or may contain another polymer. Specifically, the polymer may comprise a polymer (P1) that is selected from the above-mentioned polymers and a polymer (P2) that is different from the polymer (P1), or may comprise a polymer chain composed of the polymer (P1) and a polymer chain composed of the polymer (P2). The polymer (P1) and the polymer (P2) may be different from each other with respect to the types of the polymers, the molecular weights and the like. The ratio of the number of the polymer (P1) chains relative to the total number of the polymer (P1) chains and the polymer (P2) chains (that is, P1/(P1+P2)) is preferably not less than 0.5, more preferably not less than 0.7, still more preferably not less than 0.8, furthermore preferably not less than 0.9, particularly preferably not less than 0.96.

Examples of the monomer constituting the aromatic hydrocarbon polymer include monofunctional styrene monomers such as styrene, o-methylstyrene, m-methylstyrene, p-methylstyrene, α-methylstyrene, styrenesulfonic acid, 4-vinylbenzoic acid, tert-butyl 4-vinylbenzoate and 4-dimethylaminostyrene. These monomers may be used singly, or a proper combination of two or more of these monomers may be used.

Examples of the monomer constituting the (meth)acrylate polymer include monofunctional alkyl (meth)acrylate monomers such as (meth)acrylic acid, methyl (meth)acrylate, isopropyl (meth)acrylate, ethyl (meth)acrylate, n-butyl (meth)acrylate, tert-butyl (meth)acrylate, hexyl (meth)acrylate, 2-ethylhexyl (meth)acrylate and octyl (meth)acrylate; monofunctional hydroxyalkyl (meth)acrylate monomers such as 2-hydroxyethyl (meth)acrylate and 2,3-dihydroxypropyl (meth)acrylate; monofunctional oxyalkyl (meth)acrylate monomers such as methoxyethoxyethyl (meth)acrylate, polyethylene glycol (meth)acrylate, 3-ethyloxetanyl (meth)acrylate, methoxyethoxyethyl (meth)acrylate, 2,2-dimethyl-1,3-dioxolane-4-methanol (meth)acrylate and glycosyloxyethyl (meth)acrylate; aminoalkyl (meth)acrylate monomers such as N-aminoethyl (meth)acrylate and N,N'-dimethylaminoethyl (meth)acrylate; quaternary ammonium-containing (meth)acrylate monomers such as 3-(N-[2-(meth)acryloyloxyethyl]-N,N'-dimethylammonio)propane sulfonate, 2-(2-(meth)acryloyloxyethyl)dimethylaminoacetic acid and 2-(meth)acryloyloxyethyl phosphorylcholine; fluorine atom-containing monofunctional (meth)acrylate monomers such as 2,2,2-trifluoroethyl (meth)acrylate, 2-perfluorobutylethyl (meth)acrylate and 2-perfluorooctylethyl (meth)acrylate; and monofunctional(meth)acrylamide monomers such as (meth)acrylamide, N-isopropyl(meth)acrylamide, N,N'-dimethyl(meth)acrylamide, N,N'-diethyl (meth)acrylamide, N-methyl-N-ethyl(meth)acrylamide, N,N'-di(hydroxyethyl) (meth)acrylamide and a (3-((meth)acryloylaminopropyl)dimethyl-3-sulfopropyl) ammonium salt. These monomers may be used singly, or a proper combination of two or more of these monomers may be used.

Examples of the monomer constituting the vinylpyridine polymer include monofunctional vinylpyridine monomers such as 2-vinylpyridine, 3-vinylpyridine, 4-vinylpyridine and 1-(3-sulfopropyl)-2-vinylpyridinium hydroxide. These monomers may be used singly, or a proper combination of two or more of these monomers may be used.

An example of the monomer constituting the vinylester polymer includes vinyl acetate, and an example of the monomer constituting the vinylpyrrolidone polymer includes N-vinyl-2-pyrrolidone.

Examples of the monomer constituting the olefin polymer include olefin monomers such as ethylene and butadiene. These monomers may be used singly, or a proper combination of two or more of them may be used in combination.

The radical-polymerizable polymer may be any of a homopolymer and a copolymer. When the radical-polymerizable polymer is a copolymer, the copolymer may be any of a block copolymer, a graft copolymer and a random copolymer. It is noteworthy that a polymer other than a block copolymer can also introduce a phase-separated structure. The radical-polymerizable polymer is preferably a homopolymer or a block copolymer, more preferably a homopolymer. A homopolymer or a block copolymer enables the interaction between the polymer chains to be maintained steadily, and hence enables the fixing of the phase-separated structure to be achieved without difficulty. In the case where two or more monomers are used in combination, the content of one of the monomers is preferably not less than 80% by mass, more preferably not less than 90% by mass, still more preferably not less than 98% by mass.

The polymer chain may be in a cyclic, branched or linear form, and is preferably in a linear form. When a linear polymer chain is used, the periodicity (uniformity) of the resultant phase-separated structure can be enhanced.

The number average molecular weight of the polymer chains is preferably not less than 2,000, more preferably not less than 10,000, still more preferably not less than 50,000, and is preferably not more than 1,000,000, more preferably not more than 500,000, still more preferably not more than 300,000. When the number average molecular weight of the polymer chains falls within this range, the polymer chains can contact with a solvent easily and the phase-separated structure can be formed easily. In addition, the size of the resultant phase-separated structure can be controlled by adjusting the number average molecular weight of the polymer chains. In this regard, the phase-separated structure becomes bigger with the increase in the number average molecular weight, and the resultant phase-separated structure becomes smaller with the decrease in the number average molecular weight.

The molecular weight distribution (Mw/Mn) of the polymer chains is preferably not more than 1.3, more preferably not more than 1.1, still more preferably not more than 1.08.

The number average molecular weight of the polymer chains refers to the number average molecular weight of polymers each of which is not fixed on the surface of the substrate at either end, and can be determined by subjecting polymer chains, which are the same as those mentioned above except that the polymer chains are synthesized separately in the same manner and each of the polymer chains is not fixed on the surface of the substrate at either end, to size exclusion chromatography (SEC).

It is preferred that the polymer brush according to the present invention has a thickness of not less than 1 nm and not more than 50 nm when the polymer layer is in a non-phase-separated state and the number average molecular weight of the polymer chains is not less than 2000 and not more than 1,000,000. The phase separation can be induced by controlling both the thickness of the polymer brush in a non-phase-separated state and the number average molecular weight of the polymer chains. In this case, the thickness L of the polymer brush phase is more preferably not less than 2 nm, still more preferably not less than 3 nm, and is preferably not more than 50 nm, more preferably not more than 40 nm, still more preferably not more than 35 nm, particularly preferably not more than 30 nm. The number average molecular weight of the polymer chains is more preferably not less than 10,000, still more preferably not less than 50,000, and is preferably not more than 500,000, more preferably not more than 300,000.

The polymer brush (A) can be produced by fixing a functional group, which serves as an initiation point of a polymerization reaction, on the surface of the substrate and then polymerizing the monomer such that a polymer chain can extend from the initiation point.

Examples of the method for fixing a functional group which serves as an initiation point of the polymerization reaction include: a method in which a compound containing the functional group (which is sometimes referred to as "a brush initiator", hereinafter) on the surface of the substrate; and a method in which the functional group is formed on the substrate directly.

As the brush initiator, a compound having both a bonding group capable of bonding to the substrate and a polymerization initiating group that serves as a polymerization initiation point can be preferably used. Examples of the bonding group include: reactive silyl groups such as a trimethoxysilyl group and a triethoxysilyl group; a thiol group; a disulfide group; and a phosphoric acid group.

Examples of the polymerization initiating group include: halogenated alkyl groups such as a 1-bromoethyl group, a 1-methyl-1-bromoethyl group and a chloroethyl group; nitroxy group-containing functional groups such as a 2,2,6,6-tetramethylpiperidinyl-1-oxy group, an N-tert-butyl-1-phenyl-2-methylpropyl nitroxy group and an N-tert-butyl-1-diethylphosphono-2,2-dimethylpropyl nitroxy group; and a $SO_2Cl$ group.

Each of the bonding group and the polymerization initiating group is preferably located at an end of the brush initiator compound, and the bonding group and the polymerization initiating group are preferably bonded to each other through a bivalent group such as a phenylene group, an ether bond, a carbonyl group and a phenylmethylene group. Examples of the brush initiator include compounds represented by the following formulae (A1-1) to (A1-10), (A2-1) to (A2-3) and (A3-1). In these compounds, examples of the brush initiator having a reactive silyl group as the bonding group include compounds represented by the following formulae (A1-1) to (A1-10), examples of the brush initiator having a thiol group or a disulfide group as the bonding group include compounds represented by the following formulae (A2-1) to (A2-3), and examples of the brush initiator having a phosphoric acid group as the bonding group include compounds represented by the following formula (A3-1).

In formulae (A1-1) to (A1-10), Rs each independently represent an alkoxy group such as a methoxy group or an ethoxy group, or an alkyl group such as a methyl group or an ethyl group, and it is preferred that each of at least two, preferably at least three, of Rs that are bonded to one Si atom represents an alkoxy group.

[Chemical Formla 1]

(A1-1)

(A1-2)

(A1-3)

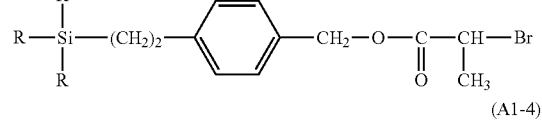
(A1-4)

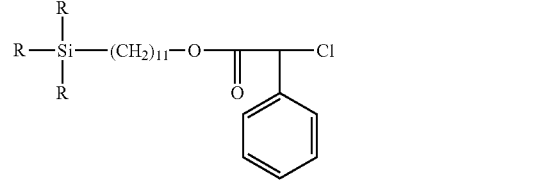
(A1-5)

n = 3, 6, 11

-continued (A1-6)
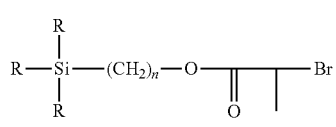
n = 3, 6, 11

(A1-7)
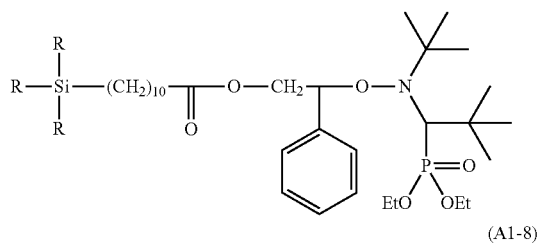

(A1-8)
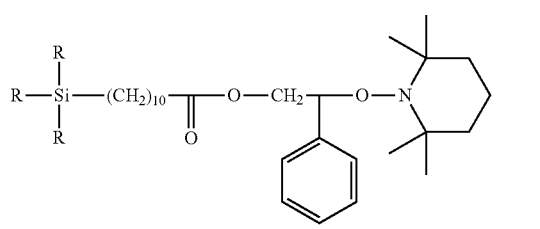

(A1-9)
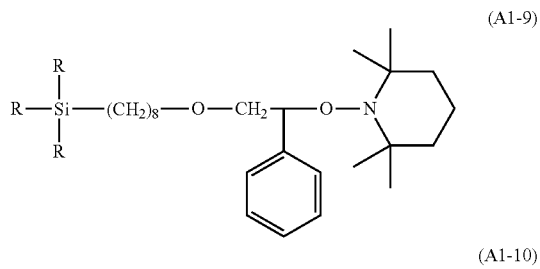

(A1-10)
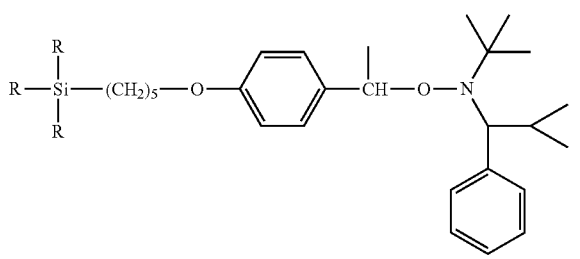

[Chemical Formula 2]

(A2-1)
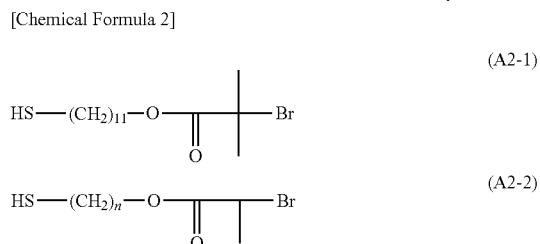

(A2-2)
HS—(CH$_2$)$_n$—O—C(=O)—C(CH$_3$)$_2$—Br n = 6, 11

(A2-3)
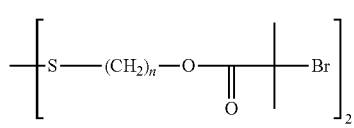

n = 10, 11

[Chemical Formula 3]

-continued (A3-1)
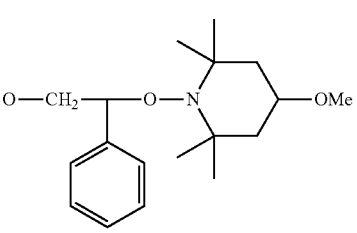

It is preferred that the type of the brush initiator is selected depending on the type of the material for the substrate. For example, when the substrate contains a silicon atom-containing compound such as glass or silicon, the bonding group in the brush initiator is preferably a reactive silyl group; when the substrate contains a metal with which a thiol group can coordinate (for example, gold), the bonding group in the brush initiator is preferably a thiol group; and when the substrate contains a metal capable of forming a salt in conjunction with phosphoric acid (for example, iron, aluminum), the bonding group in the brush initiator is preferably a phosphoric acid group.

Upon the contact of the brush initiator with the substrate, a bond (preferably a chemical bond such as a covalent bond, an ionic bond or a coordinate bond) is formed between the brush initiator and the substrate to fix the brush initiator on the surface of the substrate. In this regard, it is preferred to use a regulator having both a corresponding bonding group and a group produced by stabilizing a corresponding polymerization initiating group (a stabilized group) (the regulator is sometimes referred to as "a brush regulator", hereinafter) together with the brush initiator to allow the brush regulator to contact with the substrate simultaneously with the brush initiator, thereby fixing the brush regulator with the brush initiator simultaneously. In this manner, the fixed-end density can be controlled easily and the brush initiator can be fixed on the surface of the substrate more uniformly.

The method for stabilizing the polymerization initiating group is as follows: when the polymerization initiating group is a halogenated alkyl group, a halogen atom should be substituted by a hydrogen atom; when the polymerization initiating group is a nitroxy group-containing functional group, the functional group should be entirely substituted by a hydrogen atom; and when the polymerization initiating group is an SO$_2$Cl group, a chlorine atom should be substituted by a hydroxy group.

The molar content ratio of the brush initiator to the brush regulator (initiator/regulator) is preferably not less than 0.001, more preferably not less than 0.005, still more preferably not less than 0.01. The fixed-end density σ can increase with the increase in the ratio (initiator/regulator). The ratio (initiator/regulator) is preferably not more than 0.5, more preferably not more than 0.3, still more preferably not more than 0.2. Phase separation occurs more easily in the resulting polymer brush with the decrease in the ratio (initiator/regulator).

The total charge amount of the brush initiator and the brush regulator is preferably a large excess amount, and is specifically not less than $1 \times 10^{-3}$ mol, more preferably not less than $1 \times 10^{-2}$ mol, per 1 cm$^2$ of the substrate surface.

In light of the uniform fixation, it is preferred that the brush initiator and the brush regulator are mixed with a solvent to prepare a mixed liquid and the mixed liquid is brought into contact with the substrate, and it is more preferred that the contact is achieved by immersing the surface of the substrate in the mixed liquid.

Examples of the solvent to be used in the mixed liquid include: water; alcohol-types solvent such as methanol, ethanol, 2-propanol, butanol and 2-butanol; ketone-type solvents such as acetone, dimethyl ketone and methyl ethyl ketone; ether-type solvents; ester-type solvents; and amide-type solvents. These solvents may be used singly, or a combination of two or more of them may be used. Among these, a mixed solvent of water with a water-soluble organic solvent such as an alcohol-type solvent, a ketone-type solvent, an ether-type solvent, an ester-type solvent or an amide-type solvent is used preferably, and the water-soluble organic solvent is preferably an alcohol-type solvent. In the mixed solvent, the content of water is preferably 1 to 30% by mass, more preferably 7 to 20% by mass.

The total charge amount of the brush initiator and the brush regulator in the mixed liquid is preferably not less than 0.1% by mass, more preferably not less than 0.5% by mass, still more preferably not less than 0.7% by mass. The efficiency of the fixation increases with the increase in the charge amount. The charge amount in the mixed liquid is preferably not more than 3% by mass, more preferably not more than 2% by mass, still more preferably not more than 1.5% by mass.

The temperature at which the brush initiator is brought into contact with the substrate is not particularly limited. For example, the temperature is preferably 10 to 40° C., more preferably 15 to 30° C. The time of the contact is preferably 1 to 10 hours, more preferably 2 to 8 hours.

During the contact of the brush initiator with the substrate, a catalyst may coexist. The catalyst is preferably a basic catalyst such as ammonia; or the like. The amount of the catalyst is preferably 1 to 500 parts by mass, more preferably 50 to 300 parts by mass, still more preferably 150 to 250 parts by mass, relative to 100 parts by mass of the total charge amount of the brush initiator and the brush regulator. In the mixed liquid, the concentration of the catalyst is preferably 0.1 to 10% by mass, more preferably 0.5 to 3% by mass.

In the case where the brush initiator is hardly bonded to the substrate, the substrate may be subjected to a pretreatment. The pretreatment preferably includes the formation of a polydopamine film. As the method for forming a polydopamine film on the surface of the substrate, the method described in JP-A-2010-261001 can be employed.

A specific example of the method for forming a functional group that serves as an initiation point of the polymerization reaction on the substrate itself is a method in which the substrate is halogenated. In this case, the substrate is preferably made from a material capable of being halogenated, and is preferably made from a resin, more preferably made from an olefin resin. As the method for halogenating the substrate, the method described in JP-A-2008-133434 can be preferably employed.

After the formation of a polymerization initiation point on the surface of the substrate, the monomer is brought into contact with the polymerization catalyst to polymerize the monomer. In this manner, polymer chains of each of which one end is fixed on the substrate can be formed. The method for polymerizing the monomer is preferably a radical polymerization method, more preferably a living radical polymerization method. When a living radical polymerization method is employed, polymer chains having a narrow molecular weight distribution can be formed. Examples of the living radical polymerization method include an atom transfer radical polymerization (ATRP) method, a reversible addition/fragmentation chain transfer polymerization (RAFT) method and a nitroxide-mediated polymerization (NMP) method. Among these methods, an ATRP method and an NMP method are preferred, and an ATRP method is preferred in light of the stability of the reaction. In the ATRP method, it is preferred that the polymerization initiating group is a halogenated alkyl group. In the NMP method, it is preferred that the polymerization initiating group is a nitroxy group-containing functional group.

The monomer should be added in an excess amount relative to the amount of the polymer chains to be formed. When the monomer is added in an excess amount, the number average molecular weight of the resultant polymer chains can be controlled by adjusting the length of the polymerization duration time.

As the polymerization catalyst, a metal-containing catalyst is used. The metal in the metal catalyst reacts with the polymerization initiating group to generate carbon radical on the brush initiator, whereby the polymerization reaction can be initiated readily. Examples of the metal catalyst to be used include a halogenated metal catalyst and a metal complex catalyst. Examples of the halogenated metal catalyst include: halogenated copper catalysts such as copper (I) chloride, copper (II) chloride, copper (I) bromide and copper (II) bromide; halogenated titanium catalysts such as titanium (II) chloride, titanium (III) chloride, titanium (IV) chloride and titanium (IV) bromide; halogenated iron catalysts such as iron (II) chloride, iron (III) chloride, iron (II) bromide and iron (III) bromide; halogenated cobalt catalysts such as cobalt (II) chloride and cobalt (II) bromide; halogenated nickel catalysts such as nickel (II) chloride and nickel (II) bromide; halogenated molybdenum catalysts such as molybdenum (III) chloride and molybdenum (V) chloride; and halogenated ruthenium catalysts such as ruthenium (III) chloride. Examples of the metal complex catalyst include: a ruthenium complex catalyst; an iron complex catalyst; a nickel complex catalyst; a palladium complex catalyst; a rhodium complex catalyst; a copper complex catalyst; a rhenium complex catalyst; and a molybdenum complex catalyst. Among these catalysts, from the viewpoint of the easiness of removal, halogenated metal catalysts are preferred, and halogenated copper catalysts are preferred.

The amount of the catalyst to be used is preferably $1 \times 10^{-5}$ to $2 \times 10^{-3}$ moles, more preferably $1 \times 10^{-4}$ to $1 \times 10^{-3}$ moles, still more preferably $3 \times 10^{-4}$ to $8 \times 10^{-4}$ moles, relative to 1 mole of the monomer.

During the contact of the substrate having the polymerization initiator formed thereon with the monomer and the polymerization catalyst, a ligand may coexist. When a ligand is used, it becomes possible to control the activity of the polymerization catalyst. The ligand is preferably an electron-donating ligand. Examples of the electron-donating ligand include: polydentate amines such as tris[2-(dimethylamino)ethyl]amine, 1,4,8,11-tetraazacyclotetradecane, 1,4,8,11-tetramethyl-1,4,8,11-tetraazacyclotetradecane, 1,1,4,7,10,10-hexamethyltriethylenetetramine and N,N,N'N''N''-pentamethyldiethylenetriamine; pyridine compounds such as tris[2-pyridylmethyl]amine, N-butyl-2-pyridylmethanimine, N-dodecyl-N-(2-pyridylmethylene) amine, N-octadecyl-N-(2-pyridylmethylene)amine, N-octyl-2-pyridylmethanimine, 4,4'-dinonyl-2,2'-dipyridyl, 4,4'-di-tert-butyl-2,2'-dipyridyl, 4,4'-dimethyl-2,2'-dipyridyl, N,N,N',N'-tetrakis(2-pyridylmethyl)ethylenediamine and 2,2'-bipyridyl; phosphine compounds; and cyclopentadiene compounds. Among these compounds, polydentate amines are preferred as the ligand.

The amount of the ligand is preferably not less than 1 mole, more preferably not less than 1.5 moles, still more preferably not less than 1.8 moles, relative to 1 mole of the catalyst. When the amount of the ligand is large, the oxidation potential of a metal in the metal catalyst tends to decrease, resulting in the improvement in the reactivity of the catalyst with the polymerization initiating group. The amount of the ligand is preferably not more than 20 moles, more preferably not more than 15 moles, relative to 1 mole of the catalyst. When the amount of the ligand falls within this range, the resulting polymer chains can be purified easily.

In the polymerization of the polymer chains, a solvent may be used. Examples of the solvent to be used include: aromatic hydrocarbon-type solvents such as benzene, anisole and toluene; aliphatic hydrocarbon-type solvents such as pentane, hexane, heptane, octane, nonane and decane; alicyclic hydrocarbon-type solvents such as cyclohexane, methylcyclohexane and decahydronaphthalene; halogenated aliphatic hydrocarbon-type solvents such as chlorobenzene, dichlorobenzene, trichlorobenzene, methylene chloride, chloroform, carbon tetrachloride and tetrachloroethylene; ketone-type solvents such as acetone, methyl ethyl ketone and methyl isobutyl ketone; and ester-type solvents such as ethyl acetate and dimethyl naphthalate. These solvents may be used singly, or a combination of two or more of them may be used. Among these solvents, aromatic hydrocarbon-type solvents are preferred. In the case where the solvent is used, it is preferred to dehydrate the solvent in advance.

In the case where the solvent is used, the concentration of the monomer in a mixed solution of the monomer, the polymerization catalyst, the ligand and the solvent is preferably 0.1 to 20 mol/L, more preferably 1 to 15 mol/L, still more preferably 5 to 12 mol/L.

The polymerization temperature is generally preferably −50 to 150° C., more preferably 0 to 120° C., still more preferably 40 to 90° C. When the polymerization temperature falls within this range, the efficiency of the polymerization reaction becomes good and the polymerization stability becomes also good.

In accordance with the intended number average molecular weight of the polymer chains, a polymerization terminator is added to terminate the polymerization reaction, so that the polymerization duration time is adjusted. Examples of the polymerization terminator include: alcohols such as methanol, ethanol, propanol, 2-propanol, butanol, 2-butanol and tert-butanol; and ethers such as dimethyl ether, diethyl ether, di-n-amyl ether, tetrahydrofuran and dioxyanisole.

It is preferred that the polymer brush thus produced is washed appropriately to remove the polymerization catalyst or the like.

1-2. Phase-Separation in a Solvent (B)

In the present invention, first, the polymer free ends in the polymer brush (A) are phase-separated in a solvent (B) (which is sometimes referred to as "a phase-separation solvent (B)", hereinafter). For the selection of the solvent (B), it is helpful to refer to the phase separation behavior of a liquid (the liquid is sometimes referred to as "a model mixed liquid", hereinafter) prepared by mixing a polymer that is the same as the polymer constituting the polymer brush (A) except that one end is not fixed on the substrate, with a solvent. This is because the phase-separation behavior between the polymer brush phase and liquid phase (solvent phase) highly correlates with the phase-separation behavior of the model mixed liquid. Then, the solvent (B) to be used is a solvent of which a model mixed liquid can exert both a single-phase state and a two-phase state by varying the polymer concentration and an exterior environment (for example, a temperature, a pressure, an ion concentration, an electric field, a magnetic field; preferably a temperature, a pressure, an ion concentration or the like). When the polymer concentration and the exterior environment are to be varied, the exterior environment may be varied while fixing the polymer concentration, and the polymer concentration may be varied while fixing the exterior environment. Hereinbelow, the control of the phase separation behavior by varying the polymer concentration and the temperature will be described. In this regard, the pressure means the atmospheric pressure (1013 hPa) and the ion concentration is 0 mol/L.

The type of a suitable phase-separation solvent (B) varies depending on the type of the polymer used and hence cannot be uniquely defined. For example, the phase-separation solvent (B) can be selected among a hydrocarbon-type solvent, a halogenated hydrocarbon-type solvent, an alcohol-type solvent, a phenol-type solvent, an ether-type solvent, a ketone-type solvent, an ester-type solvent, a nitrogen compound-type solvent, a sulfur compound-type solvent and the like. These solvents (B) may be used singly, or a combination of two or more of them may be used.

Examples of the hydrocarbon-type solvent include: saturated aliphatic hydrocarbon-type solvents such as propane, butane, pentane, 2-methylbutane, hexane, 2-methylpentane, 2,2-dimethylbutane, 2,3-dimethylbutane, heptane, 2-methylhexane, 3-methylhexane, 2,3-dimethylpentane, 2,4-dimethylpentane, octane, 2,2,3-trimethylpentane, isooctane, nonane, 2,2,5-trimethylhexane, decane and dodecane; unsaturated aliphatic hydrocarbon-type solvents such as 1-pentene, 2-pentene, 1-hexene, 1-heptene, 1-octene, 1-nonene and 1-decene; aromatic hydrocarbon-type solvents such as benzene, toluene, xylene, o-xylene, m-xylene, p-xylene, ethylbenzene, cumene, mesitylene, naphthalene, tetralin, butylbenzene, p-cymene, cyclohexylbenzene, diethylbenzene, pentylbenzene, dipentylbenzene, dodecylbenzene, biphenyl and styrene; saturated alicyclic hydrocarbon-type solvents such as cyclopentane, methylcyclopentane, cyclohexane, methylcyclohexane, ethylcyclohexane, p-menthane, bicyclohexyl and decahydronaphthalene; and unsaturated alicyclic hydrocarbon-type solvents such as cyclohexene, α-pinene and dipentene.

Examples of the halogenated hydrocarbon-type solvent include: chlorinated aliphatic hydrocarbon-type solvents such as methyl chloride, dichloromethane, chloroform, carbon tetrachloride, ethyl chloride, 1,1-dichloroethane, 1,2-dichloroethane, 1,1,1-trichloroethane, 1,1,2-trichloroethane, 1,1,1,2-tetrachloroethane, 1,1,2,2-tetrachloroethane, pentachloroethane, hexachloroethane, 1,1-dichloroethylene, 1,2-dichloroethylene, trichloroethylene, tetrachloroethylene, propyl chloride, isopropyl chloride, 1,2-dichloropropane, 1,2,3-trichloropropane, allyl chloride, butyl chloride, sec-butyl chloride, isobutyl chloride, tert-butyl chloride and 1-chloropentane; chlorinated aromatic hydrocarbon-type solvents such as chlorobenzene, o-dichlorobenzene, m-dichlorobenzene, p-dichlorobenzene, 1,2,4-trichlorobenzene, o-chlorotoluene, p-chlorotoluene, 1-chloronaphthalene and chlorinated naphthalene; brominated aliphatic hydrocarbon-type solvents such as methyl bromide, bromoform, ethyl bromide, 1,2-dibromoethane, 1,1,2,2-tetrabromoethane, propyl bromide and isopropyl bromide; brominated aromatic hydrocarbon-type solvents such as bromobenzene, o-dibromobenzene and 1-bromonaphthalene; fluorinated hydrocarbon-type solvents such as fluorobenzene, benzotrifluoride and hexafluorobenzene; 1-bromo-2-chloroethane; 1,1,2-trichloro-1,2,2-trifluoroethane; and 1,1,2,2-tetrachloro-1,2-difluoromethane.

Examples of the alcohol-type solvent include: monoool-type solvents such as methanol, ethanol, 1-propanol, 2-propanol, 1-butanol, 2-butanol, isobutyl alcohol, tert-butyl alcohol, 1-pentanol, 2-pentanol, 3-pentanol, 2-methyl-1-butanol, isopentyl alcohol, tert-pentyl alcohol, 3-methyl-2-butanol, neopentyl alcohol, 1-hexanol, 2-methyl-1-pentanol, 4-methyl-2-pentanol, 2-ethyl-1-butanol, 1-heptanol, 2-heptanol, 3-heptanol, 1-octanol, 2-octanol, 2-ethyl-1-hexanol, 1-nonanol, 3,5,5-trimethyl-1-hexanol, 1-decanol, 1-undecanol, 1-dodecanol, allyl alcohol, propargyl alcohol, benzyl alcohol, cyclohexanol, 1-methylcyclohexanol, 2-methylcyclohexanol, 3-methylcyclohexanol, 4-methylcyclohexanol, α-terpineol and abietinol; diol-type solvents such as 1,2-ethanediol, 1,2-propanediol, 1,3-propanediol, 1,2-butanediol, 1,3-butanediol, 1,4-butanediol, 2,3-butanediol, 1,5-pentanediol, 2-butene-1,4-diol, 2-methyl-2,4-pentanediol and 2-ethyl-1,3-pentanediol; triol-type solvents such as glycerol, 2-ethyl-2-(hydroxymethyl)-1,3-propanediol and 1,2,6-hexanetriol; ether alcohol-type solvents such as 2-methoxyethanol, 2-ethoxyethanol, 2-(methoxymethoxy)ethanol, 2-isopropoxyethanol, 2-butoxyethanol, 2-(isopentyloxy)ethanol, 2-(hexyloxy)ethanol, 2-phenoxyethanol, 2-(benzyloxy)ethanol, diethylene glycol, diethylene glycol monomethyl ether, diethylene glycol monoethyl ether, diethylene glycol monobutyl ether, triethylene glycol, triethylene glycol monomethyl ether, tetraethylene glycol, polyethylene glycol, 1-methoxy-2-propanol, 1-ethoxy-2-propanol, dipropylene glycol, dipropylene glycol monomethyl ether, dipropylene glycol monoethyl ether, tripropylene glycol monomethyl ether, polypropylene glycol and diacetone alcohol; ester alcohol-type solvents such as furfuryl alcohol and tetrahydrofurfuryl alcohol; halogenated alcohol-type solvents such as 2-chloroethanol, 1-chloro-1,2-propanediol, 1,3-dichloro-2-propanol and 2,2,2-trifluoroethanol; 3-hydroxypropanenitrile; acetone cyanohydrin; aminoalcohol-type solvents such as 2-aminoethanol, 2-(dimethylamino)ethanol, 2-(diethylamino)ethanol, diethanolamine, N-butyldiethanolamine, triethanolamine and triisopropanolamine; and 2,2'-thiodiethanol.

Examples of the phenol-type solvent include phenol, cresol and dimethylphenol.

Examples of the ether-type solvent include: aliphatic hydrocarbon ether-type solvents such as diethyl ether, dipropyl ether, diisopropyl ether, dibutyl ether, dihexyl ether, ethyl vinyl ether and butyl vinyl ether; aromatic hydrocarbon ether-type solvents such as anisole, phenetole, butyl phenyl ether, pentyl phenyl ether, methoxytoluene, benzyl ethyl ether, diphenyl ether, dibenzyl ether, veratrole and o-nitroanisole; cyclic ether-type solvents such as propylene oxide, 1,2-epoxybutane, dioxane, trioxane, furan, 2-methylfuran, tetrahydrofuran, tetrahydropyran and cineol; polyether-type solvents such as 1,2-dimethoxyethane, 1,2-diethoxyethane, 1,2-dibutoxyethane, diethylene glycol dimethyl ether, diethylene glycol diethyl ether, diethylene glycol dibutyl ether, glycerol ether and crown ether; acetal-type solvents such as methyl and acetal; furfural; bis(2-chloroethyl)ether; epichlorohydrin; and morpholine-type solvents such as morpholine, N-ethylmorpholine and N-phenylmorpholine.

Examples of the ketone-type solvent include acetone, methyl ethyl ketone, 2-pentanone, 3-pentanone, 2-hexanone, methyl isobutyl ketone, 2-heptanone, 4-heptanone, diisobutyl ketone, acetonylacetone, mesityl oxide, phorone, isophorone, cyclohexanone, methylcyclohexanone, acetophenone, hexafluoroacetone hydrate and dichlorotetrafluoroacetone hydrate.

Examples of the ester-type solvent include: formate ester-type solvents such as methyl formate, ethyl formate, propyl formate, butyl formate, isobutyl formate and pentyl formate; acetate ester-type solvents such as methyl acetate, ethyl acetate, propyl acetate, isopropyl acetate, butyl acetate, isobutyl acetate, sec-butyl acetate, pentyl acetate, isopentyl acetate, 3-methoxybutyl acetate, sec-hexyl acetate, 2-ethylbutyl acetate, 2-ethylhexyl acetate, cyclohexyl acetate, benzyl acetate, 2-methoxyethyl acetate, 2-ethoxyethyl acetate, 2-butoxyethyl acetate, 2-phenoxyethyl acetate, diethylene glycol monoethyl ether acetate, diethylene glycol monobutyl ether acetate, methyl acetoacetate, ethyl acetoacetate, methyl cyanoacetate, ethyl cyanoacetate, chloroacetic acid, dichloroacetic acid, trichloroacetic acid and trifluoroacetic acid; propionate ester-type solvents such as methyl propionate, ethyl propionate, butyl propionate and isopentyl propionate; butyrate esters; isobutyrate esters; isovalerate esters; stearate esters; benzoate esters; ethyl cinnamate; abietate esters; bis(2-ethylhexyl) adipate; γ-butyrolactone; oxalate esters; diethyl malonate; maleate esters; dibutyl tartrate; tributyl citrate; sebacate esters; phthalate esters; ethylene glycol monoacetate; ethylene diacetate; ethylene glycol esters; diethylene glycol monoacetate; acetin-type solvents such as monoacetin and diacetin; monobutyrin; carbonate esters such as diethyl carbonate, ethylene carbonate and propylene carbonate; borate esters; phosphate esters; lactate esters; and methyl salicylate.

Examples of the nitrogen compound-type solvent include: nitrile-type solvents such as nitromethane, nitroethane, 1-nitropropane, 2-nitropropane, nitrobenzene, acetonitrile, propanenitrile, succinonitrile, butyronitrile, isobutyronitrile, valeronitrile, benzonitrile and α-tolunitrile; amine-type solvents such as methylamine, dimethylamine, trimethylamine, ethylamine, diethylamine, triethylamine, propylamine, isopropylamine, dipropylamine, diisopropylamine, butylamine, isobutylamine, sec-butylamine, tert-butylamine, dibutylamine, diisobutylamine, tributylamine, pentylamine, dipentylamine, tripentylamine, 2-ethylhexylamine and allyl amine; aniline-type solvents such as aniline, N-methylaniline, N,N-dimethylaniline, N,N-diethylaniline, toluidine and chloroaniline; cyclic amine-type solvents such as cyclohexylamine, dicyclohexylamine, pyrrole and piperidine; pyridine-type solvents such as pyridine, picoline, lutidine, quinoline and isoquinoline; polyamine-type solvents such as ethylenediamine, propylenediamine, diethylenetriamine and tetraethylenepentamine; amide-type solvents such as formamide, N-methylformamide, N,N-dimethylformamide, N,N-diethylformamide, acetamide, N-methylacetamide, N,N-dimethylacetamide, N-methylpropionamide and hexamethylphosphoric triamide; N,N,N',N'-tetramethylurea; pyrrolidone-type solvents such as 2-pyrrolidone and N-methylpyrrolidone; ε-caprolactam; and carbamate esters.

Examples of the sulfur compound-type solvent include carbon disulfide, dimethyl sulfide, diethyl sulfide, thiophene, tetrahydrothiophene, dimethyl sulfoxide, sulfolane and 1,3-propane sultone.

The boiling point of the phase-separation solvent (B) is preferably not lower than 30° C. and not higher than 150° C., more preferably not lower than 40° C., still more preferably not lower than 50° C., and is preferably not higher than 120° C., still more preferably not higher than 100° C. When the boiling point of the phase-separation solvent (B) is high, the polymer brush can be easily in a uniformly dispersed state.

When the boiling point of the phase-separation solvent (B) is low, the phase-separation solvent (B) can be removed easily.

The surface tension of the phase-separation solvent (B) at 25° C. is preferably not more than 80 mN/m, more preferably not more than 40 mN/m, still more preferably not more than 30 mN/m. When the surface tension of the phase-separation solvent (B) is reduced, a capillary force is hardly applied during the removal of the phase-separation solvent (B) and hence the polymer brush can be dried while maintaining a fine phase-separated structure. The lower limit of the surface tension of the phase-separation solvent (B) is not particularly limited, and is preferably 0.1 mN/m for example.

The phase-separation solvent (B) is preferably such a solvent that a model mixed liquid thereof has a binodal start temperature $T_{ps}$ of not lower than 1° C. and not higher than 100° C., preferably not lower than 3° C. and not higher than 90° C., under the atmospheric pressure (1013 hPa). When such a phase-separation solvent (B) is used, a uniform single-phase state can be formed upon the contact of the surface of the polymer brush (A) with the phase-separation solvent (B), and hence the uniformity of the resulting phase-separated structure can be improved.

The critical temperature refers to a temperature at the top of a line (a binodal line) that is the boundary between single-phase region and the two-phase region in the temperature phase diagram for two-component system (horizontal axis: a volume fraction of the polymer, vertical axis: a temperature) of the model mixed liquid under atmospheric pressure (1013 hPa). The temperature phase diagram of the model mixed liquid may be of an upper critical type (Upper Critical Solution Temperature: UCST) in which the binodal line is upwardly convex or may be of a lower critical type (Lower Critical Solution Temperature: LCST) in which the binodal line is downwardly convex. In light of the easiness of the removal of the solvent, a lower critical type is preferred; and in light of the stable maintenance of the phase-separated structure, an upper critical type is preferred. The presence of the phase separation can be confirmed experimentally whether or not the presence of white clouding of a mixed liquid of the polymer and the phase-separation solvent. When the mixed liquid is cloudy, it is determined that the mixed liquid is in a phase-separated state (a two-phase region); while when the mixed liquid is not cloudy, it is determined that the mixed liquid is in a compatibilized state (a single-phase region). A temperature phase diagram of the model solution can be prepared by varying the volume fraction of the polymer and the temperature and then confirming the presence or absence of phase separation. As the polymer to be used in the model mixed liquid, a polymer that is the same type as that of the polymer fixed on the polymer brush (A) can be used preferably. However, it is difficult to adjust the molecular weight distributions of these polymers to the absolutely same level. For this reason, the polymer to be used in the model solution may have a difference in molecular weight from the polymer chains in the polymer brush (A) by −10% to 10% and a difference in molecular weight distribution from the polymer chains in the polymer brush (A) by −10% to 10%. When all of the ends of the polymer in the polymer brush (A) are free-ended and the differences in molecular weight and molecular weight distribution fall within this range, the phase separation behavior of the polymer brush (A) can be predicted appropriately on the basis of the phase separation behavior of the model solution.

Examples of the combination of the polymer and the phase-separation solvent (B) include: a combination in which the polymer is an aromatic hydrocarbon polymer and the phase-separation solvent (B) is a hydrocarbon-type solvent; and a combination in which the polymer is a (meth) acrylate polymer (preferably a quaternary ammonium-containing (meth)acrylate polymer) and the phase-separation solvent (B) is a water-based solvent.

The polymer brush (A) and the solvent (B) are allowed to be contact with each other at a temperature $T_1$ at which a solution having a polymer concentration as defined by formula (1) shown below is in a phase-separated state in the temperature phase diagram of the model solution (wherein the temperature is sometimes referred to as "a phase separation temperature", "a contact start temperature", "a contact temperature" or the like, hereinafter).

Polymer concentration (volume %)=σ (nm$^{-2}$)*number average molecular weight of the polymer chain (g/mol)*10$^{21}$/(root mean square end-to-end distance of free polymer chain (nm)* Avogadro number, $Na$ (mol$^{-1}$)*polymer chain density (g/cm$^3$)   (1)

(wherein σ is assigned by the same numerical value as the fixed-end density σ (nm$^{-2}$) of the polymer brush; the concentration is sometimes referred to as "a model concentration", hereinafter.)

In the formula, the root mean square end-to-end distance $<Re^2>$ is represented by the following formula (2).

$<Re^2>=nl^2$   (2)

In the formula, n represents the degree of polymerization; and l represents the length of a segment (the length of a monomer unit).

When the contact is carried out at the above-mentioned phase separation temperature $T_1$, the free end side of the polymer brush (A) and the solvent (B) become in a phase-separation state similar to that in the model solution, and the polymer brush (A) is in the phase-separated state. It is preferred that the contact temperature $T_1$ is located, for example, preferably not less than 5° C., more preferably not less than 10° C., still more preferably not less than 12° C., away from the intersect temperature $T_{ps}$ with the binodal line at the model concentration in the model solution (wherein the temperature is referred to as "a binodal start temperature", hereinafter) toward the two-phase region side. The phase separation can be ensured with the increase in the distance between the contact temperature $T_1$ and the binodal start temperature $T_{ps}$. The contact temperature $T_1$ may be located between the intersect temperature $T_z$ with the spinodal line (wherein the temperature is referred to as "a spinodal start temperature", hereinafter) at the model concentration in the model solution and the binodal start temperature $T_{ps}$. Specifically, the phase separation temperature $T_1$ may be located, for example, preferably not less than 5° C., more preferably not less than 10° C., still more preferably not less than 12° C., away from the spinodal start temperature $T_z$ toward the single-phase region side. The difference between the contact temperature $T_1$ and the binodal start temperature $T_{ps}$ may be, for example, about not more than 50° C., preferably about not more than 40° C., still more preferably about not more than 30° C. When the phase separation temperature $T_1$ is located between the binodal start temperature $T_{ps}$ and the spinodal start temperature $T_z$, a phase-separated structure in which a minority phase (a polymer phase or a liquid phase) exists separately (for example, of a sea-island type, a cylinder type) can be formed.

The contact temperature $T_1$ can be set appropriately depending on the combination of the polymer and the temperature, and is, for example, preferably not lower than −100° C., more preferably not lower than −20° C., still more preferably not lower than 0° C., and is preferably not higher than 200° C., more preferably not higher than 120° C., still more preferably not higher than 80° C., particularly preferably not higher than 50° C.

The minority phase may be any of a polymer phase and a liquid phase, and refers to a phase having a volume fraction of not less than 0% and less than 50%. The majority phase is a phase that is not the minority phase among the polymer phase and the liquid phase, and refers to a phase having a volume fraction of not less than 50% and not more than 100%. The composition of each of the polymer phase and the liquid phase is composition at an intersect between a line of the temperature $T=T_1$ and the binodal line.

It is preferred that the contact start temperature (phase separation temperature $T_1$) is located, for example, not less than 5° C., preferably not less than 10° C., still more preferably not less than 12° C., away from the spinodal start temperature $T_z$ toward the two-phase region side. When the contact temperature $T_1$ is located on the two-phase region side relative to the spinodal start temperature $T_z$, a phase-separated structure in which each of the minority phase and the majority phase is continued at least partially (for example, an interlinked type, a lamellar type) can be formed. In this case, the difference between the contact temperature $T_1$ and the binodal start temperature $T_{ps}$ may be, for example, about not more than 80° C., preferably about not more than 70° C., still more preferably about not more than 60° C. The difference between the contact temperature $T_1$ and the spinodal start temperature $T_z$ may be, for example, about not more than 50° C., preferably about not more than 40° C., still more preferably about not more than 30° C.

The means for allowing the polymer brush (A) to contact with the phase-separation solvent (B) is not particularly limited. For example, the phase-separation solvent (B) may be casted on the surface of the polymer brush (A), or the polymer brush (A) may be immersed in the phase-separation solvent (B).

The contact time between the polymer brush (A) and the phase-separation solvent (B) at the phase separation temperature is, for example, not shorter than 1 minute, preferably not shorter than 5 minutes, more preferably not shorter than 10 minutes. The upper limit of the contact time is not particularly limited, and is 120 minutes for example.

Examples of the phase-separated structure that is formed by the contact at the phase separation temperature include: a phase-separated structure in which minority phases (for example, island parts, cylinder parts) exist separately, such as a sea-island structure, a cylinder structure (a hexagonal structure, a tetragonal structure); and a phase-separated structure in which each of the minority phase and the majority phase is continued at least partially, such as an interlinked type structure, a lamellar structure. In the sea-island structure, the majority phase forms a sea part, and the minority phase form island parts and are randomly arranged. In the cylinder structure (a hexagonal structure, a tetragonal structure), the majority phase forms a sea part and the minority phase form hexagonally or tetragonally arranged island phases. In the interlinked type structure, each of the majority phase and the minority phase forms a continuous phase. In the lamellar structure, each of the majority phase and the minority phase forms a layered (strip-shaped) phase and these phases are laminated alternately. In these phase-separated structures, any one of the polymer brush phase and the liquid phase may be the minority phase.

These phase-separated structures have two-dimensional structures when observed from the front side of the substrate (that is, a vertical direction). When observed from the side of the substrate, on the other hand, it is considered that a structure is formed in which the polymer chains are fixed uniformly on the surface of the substrate and the polymer brush phase and the liquid phase are separated from each other toward the free ends of the polymer chains. The phase-separated structure can be observed with an atomic force microscope (AFM), in which the polymer brush phase is observed as a convex part and the liquid phase is observed as a concave part.

It is preferred to contact the polymer brush (A) with the phase-separation solvent (B) in advance at a temperature $T_0$ at which the phase separation between the polymer brush (A) and the phase-separation solvent (B) does not occur, that is, a temperature $T_0$ that is located on the single-phase region side relative to the binodal start temperature $T_{ps}$, and it is preferred to disperse the polymer chains in the phase-separation solvent (B) completely, prior to the contact of the polymer brush (A) with the phase-separation solvent (B) at the phase separation temperature. An example of the procedure for dispersing the polymer chains completely includes a procedure in which the polymer brush (A) is brought into contact with the phase-separation solvent (B) and then the resulting assembly is heated to a temperature, for example, not lower than 30° C., preferably not lower than 40° C. When the temperature is shifted from the temperature $T_0$ at which the phase separation never occurs to the phase separation temperature $T_1$ while allowing the polymer brush (A) to contact with the phase-separation solvent (B), the degree of phase separation can be made uniform in the substrate surface direction.

In the case where the model solution exhibits UCST-type phase separation, the non-phase separation temperature $T_0$ is higher than the binodal start temperature $T_{ps}$ and the spinodal start temperature $T_z$, and hence can be shifted to the phase separation temperature $T_1$ by cooling. In the case where the shift to the phase separation temperature $T_1$ is to be achieved in the cooling direction, there is no concern about the occurrence of overshoot toward the temperature-increasing direction in the subsequent solvent evaporation step, and hence it becomes easy to maintain the temperature at a temperature not higher than the glass transition temperature of the polymer. On the other hand, in the case where the model solution exhibits LCST-type phase separation, the non-phase separation temperature $T_0$ is higher than the binodal start temperature $T_{ps}$ and the spinodal start temperature $T_z$, and hence can be shifted to the phase separation temperature $T_1$ by heating. In the case where the shift to the phase separation temperature $T_1$ is to be achieved in the heating direction, heat for the heating can be utilized as evaporation latent heat for the solvent, and hence the evaporation efficiency can be improved.

The structure of the resultant phase-separated structure thus formed can be changed reversibly by varying the temperature. Specifically, when the temperature is shifted from the non-phase separation temperature $T_0$ to the phase separation temperature $T_1$ and then the temperature is returned to the non-phase separation temperature $T_0$, the phase-separated structure disappears; and when the temperature is shifted to the phase separation temperature $T_1$ again, the phase-separated structure appears.

The phase separation can also be induced in the same manner as mentioned above, by varying the polymer concentration and the pressure. In this case, a pressure should be varied while contacting the polymer brush (A) with the phase-separation solvent (B). In light of the prediction of the phase separation behavior, it is preferred to keep the temperature and the ion concentration constant. When the pressure increases, the movement of the polymer chains and the phase-separation solvent (B) are restricted and the same effect at that achieved by decreasing the temperature can be achieved. For example, in a system showing UCST-type phase separation, the change from a single-phase region to a two-phase region (the induction of phase separation) can be induced by increasing the pressure, resulting in the occurrence of LCSP (Lower Critical Solution Pressure: LSCP) type phase separation; and in a system showing LCST-type phase separation, the change from a single-phase region to a two-phase region can be induced by decreasing the pressure, resulting in the occurrence of UCSP (Upper Critical Solution Pressure: UCSP) type phase separation.

Specifically, a pressure phase diagram (horizontal axis: a volume fraction of a polymer, vertical axis: a pressure) of the two-component system for model mixed liquid can be prepared by keeping the temperature and the ion concentration constant, varying the volume fraction of the polymer and the pressure, and then confirming the presence or absence of phase separation, and the contact is carried out at a pressure $P_1$ at which a solution having a polymer concentration determined by formula (1) shown above can be in a phase-separated state in the phase diagram (the pressure is sometimes referred to as "a phase separation pressure" or the like, hereinafter).

When the contact is carried out at the phase separation pressure $P_1$, the free end side of the polymer brush (A) and the solvent (B) become in a phase-separation state similar to that in the model solution, and hence the phase separation of the polymer brush (A) can be induced. The phase separation pressure $P_1$ is defined in accordance with the phase separation temperature $T_1$, and can be selected from a range that is located on the two-phase region side relative to the intersect pressure $P_{PS}$ with a binodal line at the model concentration in the model solution (the pressure is referred to as "a binodal start pressure", hereinafter), and is preferably, for example, not less than 1 kPa and not more than 1 GPa.

The structure of the resultant phase-separated structure can also be changed reversibly by varying the pressure. Specifically, the phase-separated structure disappears when the pressure is shifted from the non-phase separation pressure $P_0$ to the phase separation pressure $P_1$ and then the pressure is returned to the non-phase separation pressure $P_0$, and the phase-separated structure appears when the pressure is shifted to the phase separation pressure $P_1$ again. The non-phase separation pressure $P_0$ can be selected from pressures located in the single-phase region in the pressure phase diagram with respect to the corresponding polymer volume fraction.

The pressure can be controlled by various known means. When it is intended to increase the pressure, a pressurizing apparatus such as a compressor may be used, or the increase in pressure can be achieved by means of a physical shear flow such as a shear flow of sea water occurring during the navigation of a ship. When it is intended to decrease the pressure, a pressure-reducing apparatus such as a vacuum pump can be used.

The phase-separated structure can be changed reversibly by varying the pressure while keeping the contact of the polymer brush (A) with the phase-separation solvent (B) after the formation of the phase-separated structure.

The phase separation can also be induced in the same manner as mentioned above, by varying the polymer concentration and the ion concentration. In this case, the ion concentration should be varied while keeping the contact of the polymer brush (A) with the phase-separation solvent (B). In light of the prediction of the phase separation behavior, it is preferred to keep the temperature and the pressure constant. When the ion concentration is varied, electric charge can be neutralized or the uneven distribution of electric charge can be enhanced to decrease compatibility, resulting in the induction of the phase separation between the polymer brush (A) and the phase-separation solvent (B). In the case where the phase separation is induced by varying the ion concentration, the polymer in the polymer brush (A) is preferably a polymeric electrolyte, and an example of the monomer constituting the polymer is a quaternary ammonium-containing (meth)acrylate monomer among the above-mentioned monomers.

In the case where the ion concentration is to be varied, as in the case where the temperature or the pressure is to be varied, an ion concentration phase diagram (horizontal axis: a volume fraction of a polymer, vertical axis: an ion concentration) of the two-component system model mixed liquid can be prepared by keeping the temperature and the pressure constant, varying the volume fraction of the polymer and the ion concentration, and then confirming the presence or absence of phase separation, and the contact is carried out at an ion concentration $C_1$ at which a solution having a polymer concentration determined by formula (1) shown above can be in a phase-separation state in the phase diagram (the ion concentration is sometimes referred to as "a phase separation ion concentration" or the like, hereinafter).

When the contact is carried out at the ion concentration $C_1$, the free end side of the polymer brush (A) and the solvent (B) become in a phase-separation state similar to that in the model solution, and hence the phase separation of the polymer brush (A) can be induced. The phase separation ion concentration $C_1$ is defined in accordance with the phase separation temperature $T_1$, and can be selected from a range that is located on the two-phase region side relative to the intersect temperature $C_{PS}$ with a binodal line at the model concentration in the model solution (the temperature is also referred to as "a binodal start temperature", hereinafter), and is preferably, for example, not less than 1 mmol/L and not more than 100 mol/L in the phase-separation solvent (B).

The structure of the resultant phase-separated structure can also be changed reversibly by varying the ion concentration. Specifically, the phase-separated structure disappears when the ion concentration is shifted from the non-phase separation ion concentration $C_0$ to the phase separation ion concentration $C_1$ and then the ion concentration is returned to the non-phase separation ion concentration $C_0$, and the phase-separated structure appears when the ion concentration is shifted to the phase separation ion concentration $C_1$ again. The non-phase separation ion concentration $C_0$ can be selected from ion concentrations located in the single-phase region in the ion concentration phase diagram with respect to the corresponding polymer volume fraction.

The type of the ion may be any of a cation and an anion. Examples of the cation include: alkali metal ions such as $Li^+$, $Na^+$, $K^+$, $Rb^+$ and $Cs^+$; transition metal ions such as $Ag^+$; and an ammonium ion. Examples of the anion include: $CH_3COO^-$; $SCN^-$; $OH^-$; $NO_3^-$; and halide ions such as $F^-$, $Cl^-$, $Br^-$ and $I^-$.

The ion concentration can be controlled by coexisting an electrolyte (salt). The electrolyte (salt) is selected from salts of combinations of the above-mentioned cations or anions with the corresponding counter anions or counter cations, and should be any one as long as the electrolyte (salt) can be dissolved in the phase-separation solvent (B).

The concentration of the electrolyte (salt) to coexist is preferably not less than 1 mmol/L and not more than 100 mmol/L in the phase-separation solvent (B). The concentration of the electrolyte (salt) can also be controlled simply by the addition of the electrolyte (salt) or the like. Particularly during the navigation of ships, the concentration of the electrolyte (salt) may vary depending on the change from sea water to fresh water or the like or various types of change in water quality, and hence it is also possible to functionally control the phase separation in accordance with the change in environments.

1-3. Phase-Separation in a Gas Phase

The phase-separation state in a gas phase can be achieved by inducing phase separation in a solvent and then replacing the liquid phase by the gas phase while maintaining the phase-separated structure. In order to achieve both the maintenance of the phase-separated structure and the replacement of the liquid phase, the replacement of the liquid phase should be carried out at a temperature not higher than the glass transition temperature of the polymer chains. For the replacement of the liquid phase, a method is employed in which the phase-separation solvent is removed while keeping the temperature not higher than the glass transition temperature. For example, the following methods are included: a method in which the phase-separation solvent is evaporated, and drying methods such as a lyophilization method, a critical drying method and a supercritical drying method. In light of the maintenance of the phase-separation state (the phase-separated structure), it is preferred to remove the solvent while maintaining the temperature at which the phase separation is induced, and a method is preferred in which the phase-separation solvent is evaporated.

In the phase-separated structure of the phase-separated type polymer brush, the height difference can be reduced by, for example, heating to a temperature around the glass transition temperature $T_g$ of the polymer chains. In this manner, the surface properties (for example, a contact angle, a sliding angle) of the polymer brush can be varied. The heating temperature $T_h$ is preferably not lower than a temperature at which the difference from the glass transition temperature (that is, $T_g-T_h$) becomes, for example, not more than 20° C., more preferably not more than 10° C., still more preferably not more than 5° C. In addition, it becomes possible to allow the phase-separated structure to disappear by heating the phase-separated type polymer brush to a temperature that is not lower than the glass transition temperature $T_g$ of the polymer chains. When the polymer brush (A) in the non-phase-separated state is allowed to contact with the phase-separation solvent (B) and then exposed to a phase separation temperature, a phase-separated structure that is the same type as or a different type from the above-mentioned phase-separated state can be formed.

2. Phase-Separated Type Polymer Brush

The phase-separated type polymer brush according to the present invention can be produced in the above-mentioned manner, and comprises a substrate and a polymer layer comprising polymer chains fixed on the substrate. The phase-separated type polymer brush according to the present invention can be characterized in the respect that a polymer dense part and a polymer thin part (a gas phase part) are formed in the polymer layer (particularly on the surface of the polymer layer). On the substrate side of the polymer layer, the polymer brush is fixed on the substrate and hence the difference in density is less likely to be formed. The polymer chains can move more freely at a region that is closer to the surface of the polymer layer, and hence the difference in density between the polymer dense part and the polymer thin part is enhanced. Accordingly, when a polymer dense part and a polymer thin part (a gas phase part) are formed at least on the surface of the polymer layer, it is regarded that a polymer dense part and a polymer thin part (a gas phase part) are formed in the polymer layer. It is preferred that the polymer dense part and the polymer thin part appear periodically and repeatedly in the planar direction in the polymer layer and the periodicity is high (more periodical). The period length in the phase-separated structure corresponds to one unit of a repeating structure in which the polymer dense part and the polymer thin part appear alternately (one polymer thin part adjacent to one polymer dense part), and the periodicity can be evaluated in terms of the uniformity of a length that is the sum total of the widths or shorter diameters of the polymer dense part and the polymer thin part (that is, a period length).

The polymer dense part can be identified as a part in which the thickness of the polymer layer is larger than those of the surrounding part (a convex part). The polymer thin part can be identified as a part in which the thickness of the polymer layer is smaller than those of the surrounding part (a concave part), and corresponds to a gas phase part. More specifically, the polymer dense part is a part derived from the polymer brush phase of the phase-separated structure formed by the polymer brush and the phase-separation solvent. The shape of the polymer dense part can be fixed by removing the solvent, and hence the polymer dense layer can exist as a convex part on the surface of the polymer layer. The polymer thin part derives from the liquid phase, and can exist as a concave part on the surface of the polymer layer as the result of the replacement of the solvent portion in the liquid phase with a gas.

The polymer dense part and the polymer thin part together form a phase-separated structure to which a phase-separated structure formed by the polymer brush phase and the liquid phase is approximately transferred. When observed from the substrate front side (that is, in a vertical direction), a phase-separated structure in which the minority phase exists separately or a phase-separated structure in which each of the minority phase and the majority phase is at least partially continued can be observed. In these phase-separated structures, any of the polymer dense part and the polymer thin part may be the minority phase (for example, an island part, a cylinder part, etc.). There is a tendency that the sliding angle becomes larger with the increase in the proportion of the polymer dense part. Specifically, the sliding angle tends to increase in a phase-separated structure in which each of the minority phase and the majority phase is continued at least partially or in a phase-separated structure in which the polymer dense part is the majority phase and the minority phase exist separately.

The polymer chains are considered to cover the surface of the substrate and separate toward the surface of the polymer layer so as to form the concave parts and convex parts. Thus, it is considered to become possible to enhance (increase) the degree of hydrophilicity/hydrophobicity and also increase the sliding angle.

This phase-separated structure can be observed by measuring the height difference of the surface with an atomic force microscope (AFM).

For example, the maximum height difference between the polymer dense part and the polymer thin part is preferably not less than 1 nm, more preferably not less than 3 nm, still more preferably not less than 5 nm. The degree of roughness in the surface of the phase-separated type polymer brush increases with the increase in the maximum height difference, resulting in the alteration in surface properties (for example, a contact angle, a sliding angle). The upper limit of the height difference between the polymer dense part and the polymer thin part is not particularly limited, and is preferably not more than 50 nm for example.

The size of the phase-separated structure formed by the polymer dense part and the polymer thin part can be evaluated in terms of, for example, the size of the minority phase. Specifically, when the minority phase corresponds to a continuous phase, the size of the phase-separated structure can be evaluated in terms of the average width of the minority phase; and when the minority phase corresponds to a separated phase, the size of the phase-separated structure can be evaluated in terms of the average shorter diameter of the minority phase. As the above-mentioned average value, a mode value obtained by binarizing an AFM image (white and black) and then reducing the line thicknesses in the binarized image can be employed. The average width or the average shorter diameter is, for example, preferably not less than 0.1 nm, more preferably not less than 1 nm, still more preferably not less than 5 nm. The phase-separated structure can be retained more easily with the increase in the average width or the average shorter diameter, even under the application of a shear stress or a compressive stress. The average width or the average shorter diameter is preferably not more than 100 nm, more preferably not more than 80 nm, still more preferably not more than 70 nm. A capillary force can act more readily and liquid droplets can be held more readily with the decrease in the average width or the average shorter diameter, resulting in the improvement in the sliding angle. The average width or the average shorter diameter can be determined by measuring the widths or shorter diameters of convex parts or concave parts that form the minority phase in the AFM image and then averaging the measurement values.

The phase-separated type polymer brush according to the present invention preferably has a water contact angle of more than 90°, more preferably not less than 90.5°. The contact angle is preferably not more than 100°. The phase-separated type polymer brush according to the present invention preferably has a water sliding angle of not less than 30°, more preferably not less than 35°. The upper limit of the sliding angle is 90°. In the present invention, since the polymer brush has a phase-separated structure in a gas phase, the sliding angle can increase while enhancing (increasing) the degree of hydrophilicity/hydrophobicity.

The phase-separated type polymer brush according to the present invention has such properties that the degree of hydrophilicity/hydrophobicity is enhanced (increased) due to the formation of the phase-separated structure and the sliding angle is also large. Therefore, the phase-separated type polymer brush can be used suitably in applications, such as: films including films for agricultural use, wrapping films, shrink films and protecting films; ion exchange membranes; separation membranes; microcapsules; slow-release carriers for drug delivery systems; building materials including floor materials, floor tiles, floor sheets, sound insulation sheets, heat insulation panels, heat dissipating panels, vibration insulation materials, decorative sheets and gasket sealing materials; automotive interior/exterior materials; electricity insulation materials; liquid crystal display materials; and medical/sanitary materials. Particularly, the phase-separated type polymer brush can be used suitably in surface modified members each of which is produced by forming the polymer brush on at least a part of a surface of a member that can be used in the above-mentioned applications (a surface at which the member contacts with an exterior environment).

This application claims the benefit of priority to Japanese Patent Application No. 2014-097007 filed on May 8, 2014. The entire contents of the specifications of Japanese Patent Application No. 2014-097007 filed on May 8, 2014 are incorporated herein by reference.

EXAMPLES

The present invention is hereinafter described in more detail in the following by way of Examples, however, the present invention is not limited to the following Examples, and modifications which do not depart from the spirit and scope of the present invention are allowed and embraced within the technical scope of the present invention. Hereinafter, "part" and "%" mean "part by mass" and "% by mass", respectively, unless otherwise noted.

(Ellipsometry)

The thickness of a polymer layer in each of the polymer brushes produced in Examples 1 to 5 of the present invention and Comparative Example 1 was measured with an ellipsometer ("MASS-103", manufactured by Five Lab Co., Ltd.) at a wavelength of 620 nm and an incident angle of 70° of incident light.

The thickness of each of the polymer brushes before phase separation was calculated by a rotating retarder method using the above parameters.

(Observation with AFM)

The phase-separated structure in each of the phase-separated type polymer brushes produced in Examples 1 to 5 and Comparative Example 1 was observed in each of a gas phase and a liquid phase (cyclohexane, water) with an atomic force microscope ("Cypher", manufactured by Oxford Instruments) in an environment-controlled cell having ambient pressure (1013 hPa) and a temperature of 10° C., 20° C. or 30° C. in a tapping mode. A probe used was "BL-AC40TS-C2" manufactured by Olympus Corporation.

(Measurement of Molecular Weight)

A molecular weight (a number average molecular weight, a weight average molecular weight) and a molecular weight distribution were determined by dissolving polystyrene, which was synthesized separately and had the same molecular weight as that of polystyrene used in Examples and was not fixed, in tetrahydrofuran and then subjecting the resulting solution to size exclusion chromatography with an HPLC system (manufactured by Shimadzu Corporation).

(Measurement of Contact Angle)

A contact angle was measured with a contact angle meter ("DSA10 Mk2", manufactured by KRUSS). The amount of water droplets or a methanol/water mixed liquid (methanol:water=90:10 (by volume)) measured was 2 µL.

(Measurement of Sliding Angle)

A sliding angle was measured with the same device as used in the contact angle measurement. Each of the polymer brushes produced in Examples 1 to 3 and Comparative Example 1 was fixed horizontally, and then distilled water (10 µL) was dropped on the polymer brush to form water droplets on the polymer brush. Subsequently, the polymer brush having water droplets formed thereon was tilted at a rate of 1°/sec., and an angle of the coated plate was measured at which the water droplets started to roll down.

Example 1

(Preparation of Polymer Brush)

(2-Bromo-2-methyl)propionyloxyhexyltriethoxysilane (BHE) (0.1 parts) that served as a brush initiator was mixed with 2-methylpropionylhexyltriethoxysilane (HHE) (0.9 parts) that served as a brush regulator, and then the resulting mixture was further mixed with ethanol (89 parts) and 20% aqueous ammonia (10 parts). A silicon wafer was immersed in the mixed solution, and then allowed to leave at room temperature (25° C.) for 4 hours, thereby fixing the brush initiator (BHE) and the brush regulator (HHE) on the surface of the silicon wafer. Subsequently, the silicon wafer was removed from the mixed solution, then subjected to ultrasonic washing in ethanol, and then dried under vacuum at 60° C., thereby fixing the brush initiator (BHE) and the brush regulator (HHE) on the silicon wafer.

Into a polymerization tube (1) were charged the silicon wafer having the brush initiator (BHE) and the brush regulator (HHE) fixed thereon and a styrene monomer (6.0 mL (52 mmol)). Separately, in another polymerization tube (2), CuBr (4.5 mg (0.031 mmol)) that served as a polymerization catalyst, a 0.2 M anisole solution (0.31 mL (0.062 mmol)) of tris[2-(dimethylamino)ethyl]amine ($Me_6TREN$) that served as a ligand, and a 0.21 M isopropanol solution (0.15 mL (0.032 mmol)) of an unfixed polymerization initiator ethylbromoisobutyrate were mixed together.

Into the polymerization tube (1) into which the silicon wafer and the styrene monomer had been charged was charged the anisole solution of the polymerization catalyst and the ligand in the polymerization tube (2). The resulting solution was heated to 75° C. to initiate living radical polymerization (an ATRP method). The solution was stirred for 19 hours to continue the reaction, and then a small amount (2 g) of tetrahydrofuran was charged into the solution to terminate the reaction.

The polymer brush thus produced was washed with toluene and then dried. In this manner, a polymer brush No. 1 which can be used in a phase-separated type polymer brush according to the present invention was produced. Unfixed polystyrene was re-precipitated with methanol, then dried, and then used in the measurement of a molecular weight. The molecular weight was 150,000, and the molecular weight distribution was 1.07.

The polymer brush No. 1 was immersed in cyclohexane under ambient pressure (1013 hPa) at room temperature (25° C.), and then allowed to leave at 50° C. for 3 minutes while keeping the solution under ambient pressure until the temperature of the solution decreased to 10° C. In this state, the structure of the polymer brush No. 1 was observed with an AFM. The result is shown in FIG. 3. Subsequently, the temperature of the solution was changed to 20° C.→30° C.→10° C.→30° C. while keeping the solution under ambient pressure, and the observation with the AFM was carried out at each of the temperatures. The results are shown in FIG. 7.

Subsequently, the temperature of the solution was adjusted to 10° C. while immersing the polymer brush No. 1 in cyclohexane, and then cyclohexane was evaporated while maintaining the ambient pressure and the temperature (10° C.). The phase-separated structure of the phase-separated type polymer brush No. 1 thus produced was observed with an AFM (ambient pressure, room temperature). The result is shown in FIG. 6.

Examples 2, 3, Comparative Example 1

The same procedure as in Example 1 was carried out, except that the brush initiator (BHE) and the brush regulator (HHE) were used in the amounts shown in Table 1. In this manner, polymer brushes Nos. 2 and 3 and a comparative polymer brush No. 1 were produced. Subsequently, the same procedure as in Example 1 was carried out to produce phase-separated type polymer brushes Nos. 2 and 3 and a comparative polymer brush No. 1. The AFM images of the polymer brushes Nos. 2 and 3 and the AFM images of the phase-separated type polymer brushes Nos. 2 and 3 are shown in FIGS. 2 and 1 and FIGS. 5 and 4, respectively.

Example 4

The same procedure as in Example 1 was carried out, except that the brush initiator (BHE) and the brush regulator (HHE) were used in the amounts shown in Table 1. In this manner, the brush initiator (BHE) and the brush regulator (HHE) were fixed on a silicon wafer.

Into a polymerization tube (1) were charged the silicon wafer having the brush initiator (BHE) and the brush regulator (HHE) fixed thereon and a 3-(N-[2-(meth)acryloyloxyethyl]-N,N'-dimethylammonio)propane sulfonate monomer/2,2,2-trifluoroethanol solution (1.0 mL (40 mmol)). Separately, in another polymerization tube (2), CuBr (3.0 mg (0.021 mmol)) that served as a polymerization catalyst, 2,2'-bipyridyl (6.5 mg (0.042 mmol)) and an unfixed polymerization initiator ethylbromoisobutyrate (4.1 mg (0.021 mmol)) were mixed together in 2,2,2-trifluoroethanol (1.0 mL).

Into the polymerization tube (1) having the silicon wafer and the 3-(N-[2-(meth)acryloyloxyethyl]-N,N'-dimethylammonio)propane sulfonate monomer charged thereinto was charged the 2,2,2-trifluoroethanol solution of the polymerization catalyst and the ligand in the polymerization tube (2). The resulting solution was heated to 60° C. to initiate living radical polymerization (an ATRP method) of the solution. The solution was stirred for 18 hours to continue the reaction, and then the resulting reaction solution was exposed to air at 0° C. to terminate the reaction.

A polymer brush thus produced was washed with 2,2,2-trifluoroethanol and then dried, thereby producing a polymer brush No. 4 which can be used in a phase-separated type polymer brush according to the present invention. Unfixed poly(3-(N-[2-(meth)acryloyloxyethyl]-N,N'-dimethylammonio)propane sulfonate) (PMAPS) was re-precipitated with methanol, then dried, and then subjected to the measurement of a molecular weight. The molecular weight was 152,000 and the molecular weight distribution was 1.14.

The obtained polymer brush No. 4 was immersed in water under ambient pressure (1013 hPa) at 50° C., and then allowed to leave for 3 minutes, and then the solution was cooled to 10° C. In this state, the structure of the polymer brush No. 4 was observed with an AFM. As a result, an interlinked type structure was confirmed. The AFM observation result at 10° C. is shown in FIG. 8.

Example 5

The same procedure as in Example 4 was carried out, except that the brush initiator (BHE) and the brush regulator (HHE) were used in the amounts shown in Table 1. In this manner, a polymer brush No. 5 was produced. In this state, the structure of the polymer brush No. 5 was observed with an AFM. The observation with the AFM was carried out at 10° C., and the existence of a sea-island structure in which the minority phase was a liquid phase was confirmed. The result of the observation with the AFM at 10° C. is shown in FIG. 9. Furthermore, the temperature of the solution was changed to 10° C.→50° C.→20° C.→30° C. while maintaining the ambient pressure, and the polymer brush was observed with the AFM at each of the temperatures. It was demonstrated that a phase-separated structure appeared reversibly, as in the case of the polymer brush No. 1 (FIG. 7).

The polymer layer thicknesses L and the fixed-end densities σ ($nm^{-2}$) of the polymer brushes of Examples 1 to 5 and Comparative Example 1 before phase separation are shown in Table 1. The types of the phase-separated structures in these phase-separated type polymer brush, as well as the static contact angles (θ) of water, the forward contact angles ($θ_A$), reverse contact angles ($θ_R$), sliding angles ($θ_S$) and static contact angles (θ) of methanol/water solutions (methanol:water=90:10 (by volume)) of the phase-separated polymer brushes Nos. 1 to 5 and the comparative polymer brush No. 1 are shown in Table 2.

TABLE 1

| | Polymer Brush No. | | | | | |
| --- | --- | --- | --- | --- | --- | --- |
| | No. 1 | No. 2 | No. 3 | No. 4 | No. 5 | Comparative No. 1 |
| brush initiator (parts) | 0.1 | 0.033 | 0.021 | 0.033 | 0.019 | 1 |
| brush adjuster (parts) | 0.9 | 0.967 | 0.979 | 0.967 | 0.981 | 0 |
| film thickness (nm) | 12.1 | 6 | 4.5 | 6.4 | 5.2 | 84.1 |
| fixed end density ($nm^{-2}$) | 0.055 | 0.027 | 0.02 | 0.027 | 0.022 | 0.38 |

TABLE 2

| | | Example 1 | Example 2 | Example 3 | Comparative Example 1 |
| --- | --- | --- | --- | --- | --- |
| phase separated type polymer brush No. | | No. 1 | No. 2 | No. 3 | Comparative No. 1 |
| phase separated structure | | sea-island structure (minority phase: poymer phase) | interlinked structure | sea-island structure (minority phase: liquid phase) | none |
| contact angle (vs. water) | θ | 94.4 | 91.2 | 90.6 | 90 |
| | $θ_A$ | 97.2 | | | 95 |
| | $θ_R$ | 83.6 | | | 83 |
| | $θ_S$ | 40.5 | over 90 | over 90 | 29.3 |
| contact angle (vs. water/methanol) | θ | 15.2 | 20.3 | 26.9 | 31.6 |
| AFM image | in a liquid phase | FIG. 1 | FIG. 2 | FIG. 3 | |
| | in a gas phase | FIG. 4 | FIG. 5 | FIG. 6 | |

Each of the polymer brushes according to the present invention had a smooth surface having a root mean square surface roughness of not more than 0.5 nm in air before the phase separation. In a phase-separation solvent (cyclohexane, water) under an environment of ambient pressure and 10° C., however, the surface roughness of each of the polymer brushes was increased and a phase-separated structure such as a sea-island structure and an interlinked type structure appeared. In addition, when the phase-separation solvent (cyclohexane, water) phase was replaced by a gas, the phase-separated structure was also retained in the gas phase. It was demonstrated that the phase-separated structure of the surface of each of the phase-separated type polymer brushes had a height difference of the order of about several tens of nm, and had such surface properties that the degree of hydrophilicity/hydrophobicity was largely enhanced (increased) and the sliding angle was large.

INDUSTRIAL APPLICABILITY

The present invention can be applied suitably in applications, such as: films including films for agricultural use, wrapping films, shrink films and protecting films; ion exchange membranes; separation membranes; microcapsules; slow-release carriers for drug delivery systems; building materials including floor materials, floor tiles, floor sheets, sound insulation sheets, heat insulation panels, heat dissipating panels, vibration insulation materials, decorative sheets and gasket sealing materials; automotive interior/exterior materials; electricity insulation materials; liquid crystal display materials; and medical/sanitary materials.

The invention claimed is:

1. A polymer brush comprising a substrate and a polymer layer,
    wherein the polymer layer comprises polymer chains each of which has one end fixed on the substrate and other end free-ended,
    wherein the polymer chains are formed by fixing a brush initiator having a polymerization initiating group on a surface of the substrate and polymerizing a monomer,
    wherein a state of phase-separation between a polymer dense part and a polymer thin part reversibly changes in the polymer layer, and
    wherein the maximum height difference between the polymer dense part and the polymer thin part is not less than 1 nm.

2. The polymer brush according to claim 1, wherein the polymer layer thickness is not less than 1 nm and not more than 50 nm provided that the polymer layer is in a non-phase-separated state, and wherein the number average molecular weight of the polymer chain is not less than 2,000 and not more than 1,000,000.

3. The polymer brush according to claim 1, wherein the phase-separated structure is reversibly controlled with the exterior environment change.

4. The polymer brush according to claim 3, wherein the exterior environment is any one selected from the group consisting of temperature, pressure, and ion concentration.

5. The polymer brush according to claim 1, wherein a polymer dense part and a polymer thin part is formed in the polymer layer.

6. The polymer brush according to claim 5, wherein a plurality of the polymer dense parts and a plurality of the polymer thin parts appear periodically and repeatedly in the planar direction in the polymer layer.

7. The polymer brush according to claim 5, wherein a structure formed by a phase-separation between the polymer dense part and the polymer thin part is any one selected from the group consisting of sea-island structure, cylinder structure, interlinked structure, and lamellar structure.

8. A process for controlling a surface state comprising
contacting the polymer brush according to claim 1 with a solvent, and
changing exterior environment.

9. The process for controlling a surface state according to claim 8, wherein the exterior environment change is provided by any one selected from the group consisting of solvent temperature, pressure and ion concentration.

10. A process for producing a phase-separated type polymer brush, said process comprising
fixing a brush initiator having a polymerization initiating group on a surface of a substrate,
polymerizing a monomer to form a polymer brush (A) comprising the substrate and a polymer layer comprising at least one polymer chain each of which has one end fixed on the substrate with fixed-end density of $\sigma$ ($nm^{-2}$) and other end free-ended,
contacting the polymer brush (A) with a solvent (B) at a temperature where a solution of the polymer chain with the polymer concentration determined by the following formula (1) is in a phase-separated state in a phase diagram provided that the polymer chain is in a free state without bonding to the substrate, Polymer concentration (volume %)=$\sigma$ ($nm^{-2}$)×number average molecular weight of the polymer chain (g/mol)×$10^{21}$) ÷(root mean square end-to-end distance of free polymer chain (nm)× Avogadro number, $Na$ ($mol^{-1}$)×polymer chain density (g/cm³))   (1), and
replacing the solvent to a gas below the glass transition temperature of the polymer while keeping the temperature within the phase-separated state in the phase diagram.

11. The process for producing a polymer brush according to claim 10, wherein the fixed end density of the polymer chain, $\sigma$ is not less than 0.001 ($nm^{-2}$) and not more than 0.1 ($nm^{-2}$).

12. The process for producing a polymer brush according to claim 10, wherein the solvent (B) is a solvent with a binodal start temperature of not less than 1° C. and not more than 100° C. provided that the solvent (B) is mixed with the polymer chain in a free state without bonding to the substrate at a polymer concentration determined by the previous formula (1).

13. The process for producing a polymer brush according to claim 10, wherein the combination of the polymer and the solvent (B) is
(1) polymer: aromatic hydrocarbon polymer, and solvent (B): hydrocarbon solvent, or
(2) polymer: (meth)acryl polymer, and solvent (B): water-based solvent.

14. A process for preparing phase-separated structure comprising
heating the polymer brush according to claim 1 over glass transition temperature of the polymer.

15. A surface modified member having the polymer brush according to claim 1 formed on the surface of the member.

* * * * *